(12) United States Patent
Hamada et al.

(10) Patent No.: US 8,188,588 B2
(45) Date of Patent: May 29, 2012

(54) MANUFACTURING METHOD OF SUBSTRATE FOR A SEMICONDUCTOR PACKAGE, MANUFACTURING METHOD OF SEMICONDUCTOR PACKAGE, SUBSTRATE FOR A SEMICONDUCTOR PACKAGE AND SEMICONDUCTOR PACKAGE

(75) Inventors: Yoichiro Hamada, Tokyo (JP); Shigeru Hosomomi, Isa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 164 days.

(21) Appl. No.: 12/656,866

(22) Filed: Feb. 18, 2010

(65) Prior Publication Data

US 2010/0213620 A1  Aug. 26, 2010

(30) Foreign Application Priority Data

Feb. 20, 2009 (JP) .................. 2009-038563
Jan. 5, 2010 (JP) .................. 2010-000305

(51) Int. Cl.
*H01L 23/48* (2006.01)

(52) U.S. Cl. ........ 257/690; 257/692; 257/693; 257/734; 257/773; 257/786; 257/E23.02

(58) Field of Classification Search ........... 257/666–677
See application file for complete search history.

(56) References Cited

U.S. PATENT DOCUMENTS 6,333,252 B1  12/2001  Jung et al.
6,420,779 B1 *  7/2002  Sharma et al. ............... 257/666
7,589,404 B2 *  9/2009  Itou et al. .................... 257/676
2007/0102813 A1  5/2007  Nakao

FOREIGN PATENT DOCUMENTS

| JP | 02-027318 A | 1/1990 |
| JP | 11-195733 A | 7/1999 |
| JP | 2002-009196 A | 1/2002 |
| JP | 2005-257712 A | 9/2005 |
| JP | 2006-310570 A | 11/2006 |
| JP | 2007-103450 A | 4/2007 |

OTHER PUBLICATIONS

Office Action mailed Jun. 7, 2011, issued for the corresponding Japanese patent application No. 2010-000305 and English translation thereof.

* cited by examiner

*Primary Examiner* — Jasmine Clark
(74) *Attorney, Agent, or Firm* — Edwards Wildman Palmer LLP

(57) ABSTRACT

A manufacturing method of a substrate for a semiconductor package includes a resist layer forming step to form a resist layer on a surface of a conductive substrate; an exposure step to expose the resist layer using a glass mask with a mask pattern including a transmission area, a light shielding area, and an intermediate transmission area, wherein transmittance of the intermediate transmission area is lower than that of the transmission area and is higher than that of the light shielding area; a development step to form a resist pattern including a hollow with a side shape including a slope part decreasing in hollow circumference as the hollow circumference approaches the substrate; and a plating step to plate on an exposed area to form a metal layer with a side shape including a slope part decreasing in circumference as the circumference approaches the substrate.

4 Claims, 12 Drawing Sheets

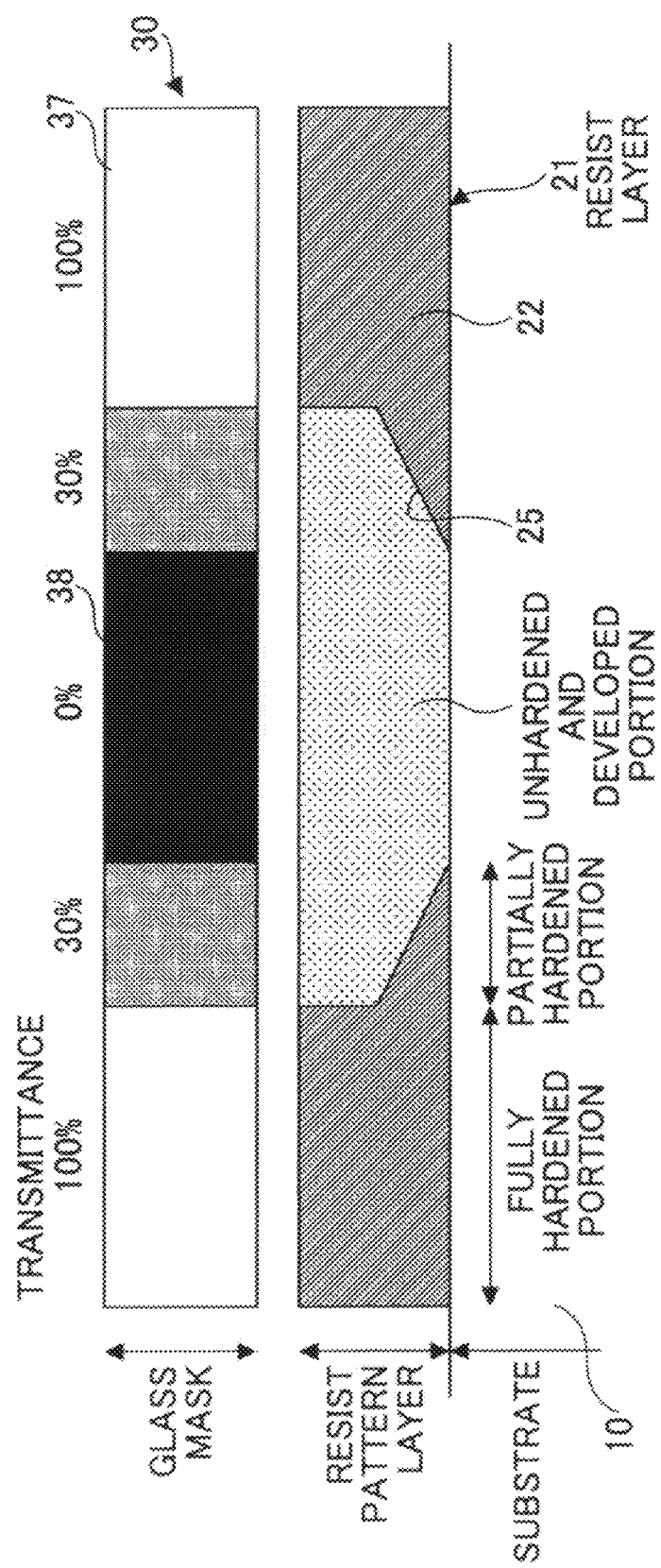

※VERTICALLY INVERTED

※VERTICALLY INVERTED

US 8,188,588 B2

MANUFACTURING METHOD OF SUBSTRATE FOR A SEMICONDUCTOR PACKAGE, MANUFACTURING METHOD OF SEMICONDUCTOR PACKAGE, SUBSTRATE FOR A SEMICONDUCTOR PACKAGE AND SEMICONDUCTOR PACKAGE

CROSS-REFERENCE TO RELATED APPLICATIONS

This patent application is based upon and claims the benefit of priority of Japanese Patent Application No. 2009-38563 filed on Feb. 20, 2009 and Japanese Patent Application No. 2010-000305 filed on Jan. 5, 2010 the entire contents of which are incorporated herein by reference.

BACKGROUND OF THE INVENTION

1. Field of the Invention

The present invention relates to a manufacturing method of a substrate for a semiconductor package, a manufacturing method of a semiconductor package, a substrate for a semiconductor package and a semiconductor package.

2. Description of the Related Art

Conventionally, a semiconductor package manufacturing method where a semiconductor device is sealed with resin is known as disclosed in Japanese Published Patent Application No. 2002-9196 (which is hereinafter called "Patent Document 1"). In the semiconductor manufacturing method, to begin with, a resist pattern layer with a predetermined pattern is formed on a conductive surface of a substrate. Then, conductive metal is electrodeposited on an exposed surface of the conductive surface of the substrate uncovered with the resist pattern layer so that a thickness of the conductive metal is over that of the resist pattern layer, by which a metal layer for semiconductor device mounting and electrode layers are respectively formed so as to have flared portions. After removing the resist pattern layer, a semiconductor device is mounted on the metal layer, and electrodes on the semiconductor device are electronically connected to the electrode layers by bonding wires. Finally, the semiconductor device mounting part is sealed with resin, and the substrate is removed. As a result, back surfaces of the metal layer and electrode layers are exposed, and a semiconductor device in a resin sealed body, a semiconductor package, is obtained.

According to the semiconductor package manufacturing method, because the flared portions are set to bite into the resin, binding power is improved due to the effect of biting. This helps important parts such as the metal layer and electrode layers stay in the resin sealed body without being pulled apart by sticking to the substrate, which can effectively prevent displacement and lack of the important parts. The semiconductor package manufacturing method also serves to ensure bonding strength after soldering the semiconductor device on a substrate for electronic components.

In addition, the characteristic flared shape formed around a whole circumference of a top edge of the metal layer and the electrode layers can prevent water from intruding from a backside of the semiconductor package through a boundary division between the metal layer or each of the electrode layers and the sealing resin layer, which can improve humidity resistance of the semiconductor package.

However, according to a configuration of Patent Document 1, because the electrodeposition is made over the resist pattern and not controlled by the resist pattern in a transverse direction, the electrodeposition process is susceptible to the effect of a distribution of current density, which makes it difficult to keep the length of the flared portions constant. This causes variation in the binding power between the electrode layers or metal layer and the resin. In addition, because the electrodeposition process is performed without any control by the resist pattern of its top surface, the top surface does not become flat, and a poor connection of a bonding wire tends to occur.

In recent years, because of semiconductor package downsizing advances, and semiconductor devices used for the semiconductor package have also tended to be miniaturized, an electrode layer of a substrate for a semiconductor device needs to be miniaturized and to realize high accuracy.

However, as disclosed in Patent Document 1, if the size of an electrode layer provided corresponding to a semiconductor device cannot be controlled with a high degree of accuracy, there is a concern that adapting miniaturization in the future may be impossible. Moreover, to obtain a certain biting effect between the electrode layers or metal layer and the resin, a length of the flared portion needs to be in a range of 5 to 20 μm. However, because a necessary thickness of the electrode layers and metal layer increases as the flared portion becomes longer, there is a concern that the semiconductor package manufacturing method disclosed in Patent Document 1 cannot be adapted to a tendency for a thinner semiconductor package.

SUMMARY OF THE INVENTION

Accordingly, embodiments of the present invention may provide a novel and useful manufacturing method of a substrate for a semiconductor package, a manufacturing method of a semiconductor package, a substrate for a semiconductor package and a semiconductor package solving one or more of the problems discussed above.

More specifically, the embodiments of the present invention may provide a manufacturing method of a substrate for a semiconductor package, a manufacturing method of a semiconductor package, a substrate for a semiconductor package, and a semiconductor package whereby a size of a metal layer and an electrode layer is uniform; binding power of sealing resin is stable and strong; an electrode top surface is flat enough to have a superior bonding ability; and adaptation to miniaturization and reducing a thickness of a semiconductor package is possible.

One aspect of the present invention may be to provide a manufacturing method of a substrate for a semiconductor package including, a resist layer forming step to form a resist layer on a surface of a conductive substrate;

a lithographic exposure step to expose the resist layer using a glass mask with a mask pattern including a transmission area, a light shielding area, and an intermediate transmission area disposed between the transmission area and the light shielding area, wherein transmittance of the intermediate transmission area is lower than that of the transmission area and is higher than that of the light shielding area;

a development step to develop the resist layer and to form a resist pattern including a hollow with a side shape including a slope part decreasing in hollow circumference as the hollow circumference approaches to the substrate;

a plating step to plate on an exposed area of the substrate by using the resist pattern and to form a metal layer with a side shape including a slope part decreasing in circumference as the circumference approaches the substrate; and a resist removal step to remove the resist pattern.

Another aspect of the present invention may be to provide a manufacturing method of a semiconductor package including, a resist layer forming step to form a resist layer on a surface of a conductive substrate;

a lithographic exposure step to expose the resist layer using a glass mask with a mask pattern including a transmission area, a light shielding area, and an intermediate transmission area disposed between the transmission area and the light shielding area, wherein transmittance of the intermediate transmission area is lower than that of the transmission area and is higher than that of the light shielding area;

a development step to develop the resist layer and to form a resist pattern including a hollow with a side shape including a slope part decreasing in hollow circumference as the hollow circumference approaches the substrate;

a plating step to plate on an exposed area of the substrate by using the resist pattern and to form metal layers with a side shape including a slope part decreasing in circumference as the circumference approaches the substrate;

a resist removal step to remove the resist pattern;

a semiconductor device mounting step to mount a semiconductor device on one of the metal layers of the substrate;

a wire bonding step to connect a terminal of the semiconductor device to another metal layer of the metal layers as an electrode;

a sealing step to seal the semiconductor device mounted on one of the metal layers of the substrate with resin; and a substrate removal step to remove the substrate from the semiconductor device.

Another aspect of the present invention may be to provide a substrate for a semiconductor package including, an electrode of a metal layer on a substrate; and a semiconductor mounting area of a metal layer on the substrate, wherein at least one of the electrode and the semiconductor mounting area has a top surface in a zigzag shape and a side surface including a slope part decreasing in circumference and having the zigzag shape decreasing in size as the circumference approaches the substrate.

Another aspect of the present invention may be to provide a semiconductor package including, an electrode metal layer including a top surface used for wire bonding and a bottom surface used for an outer terminal;

a semiconductor device mounting metal layer to support a semiconductor device;

a semiconductor device mounted on the semiconductor device mounting metal layer and including a terminal connected to the electrode metal layer by the wire bonding; and a resin body to seal the semiconductor device without sealing the bottom surface of the electrode metal layer, wherein at least one of the electrode metal layer and the semiconductor device mounting metal layer has a top surface in a zigzag shape and a side surface including a slope part decreasing in circumference and having the zigzag shape decreasing in size as the circumference approaches a bottom surface.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 4 is an explanation view to explain an example of a relationship between a glass mask and a resist pattern;

DETAILED DESCRIPTION OF THE PREFERRED EMBODIMENTS

A description is given below, with reference to drawings of embodiments of the present invention.

First Embodiment

Figure 1A:
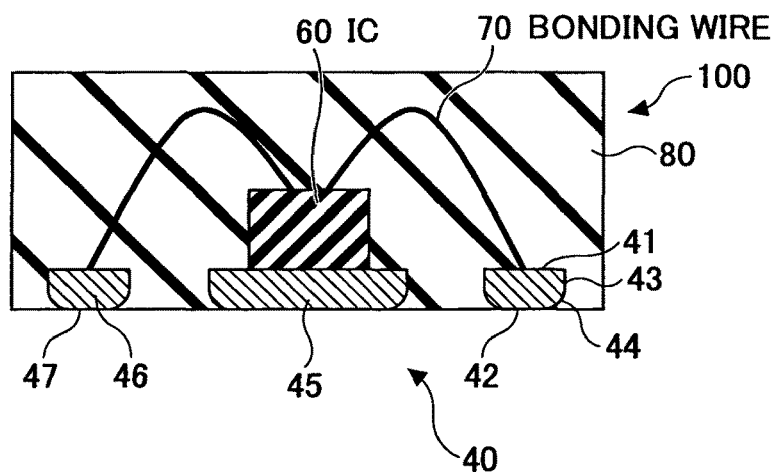
FIG. 1A is a side view of a semiconductor package of a first embodiment of the present invention.
Figure 1B:
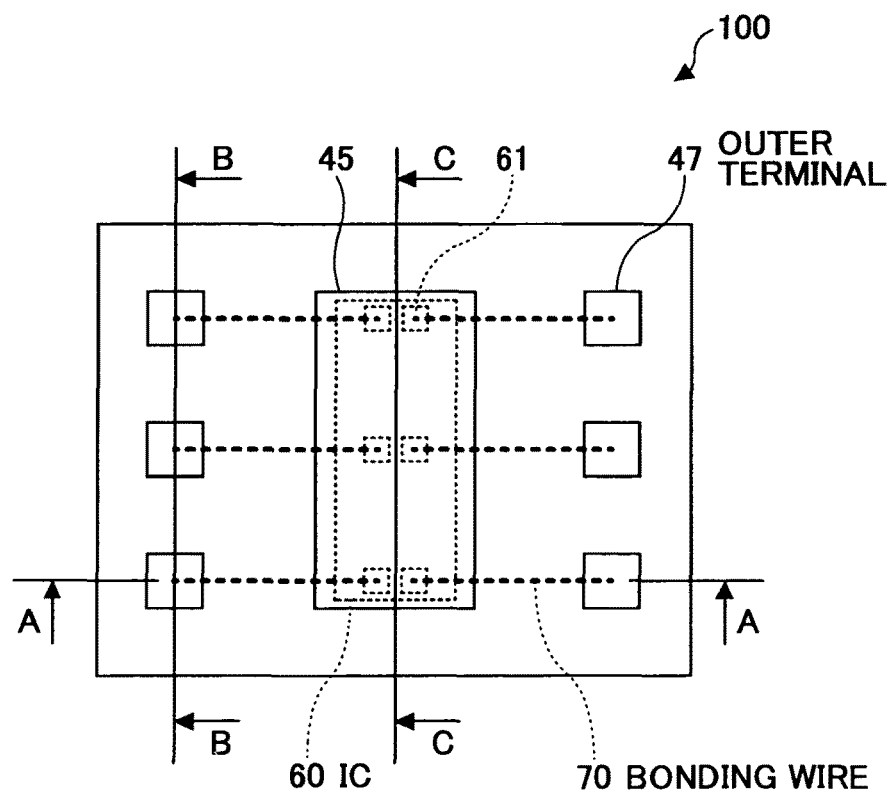
FIG. 1B is a bottom view of a semiconductor package of a first embodiment of the present invention.

FIG. 1A and FIG. 1B are views showing an example of a finished product of a semiconductor package 100 of a first embodiment of the present invention. FIG. 1A is a side view showing an example of the finished product of the semiconductor package 100. FIG. 1B is a bottom view showing the finished product of the semiconductor package 100.

In FIG. 1A, the semiconductor package 100 of the first embodiment includes metal layers 40, a semiconductor device 60, bonding wires 70 and sealing resin 80.

The metal layers 40 are formed of metal material. The metal layers 40 have a top surface 41, a bottom surface 42 and a side surface 43. For example, the metal layers 40 may by formed by plating and so on.

The metal layers 40 include a semiconductor device mounting area 45 and an electrode 46. The semiconductor device mounting area 45 is an area to support the semiconductor device 60. A surface of the semiconductor device 60 without a terminal 61 (refer to FIG. 1B) is bonded on the top surface 41 of the semiconductor device mounting area 45, by which the semiconductor device 60 is mounted on the semiconductor device mounting area 45. An end of the bonding wire 70 is connected to the terminal 61 of the semiconductor device 60. The electrode 46 is a metal layer that is electrically connected to the terminal 61 of the semiconductor device 60. The other end of the bonding wire 70 is connected to the top surface 41 of the electrode 46. The bottom surface 42 of the electrode 46 is exposed and becomes an outer terminal 47 to be able to connect to outside wiring.

The metal layer 40 has a side surface shape where the width is the greatest at the top surface 41 and decreases as a level approaches the bottom surface 42, including a tapering slope part 44 such carved inward. By having a side surface shape including the slope part 44, the width of which decreases as the level approaches the bottom surface 42, the sealing resin 80 wraps around the metal layer 40 from a lower side. This prevents a phenomenon where the metal layer 40 is pulled out downward from the sealing resin 80, and can improve humidity resistance. Details on these points are described below.

The semiconductor device 60 is a packaged device as an IC (Integrated Circuit) that includes a predetermined electronic circuit on a semiconductor chip. The semiconductor device 60 includes plural terminals 61 for input and output connections to the internal electronic circuit. However, since the distance between the terminals 61 is extremely short, as shown in FIG. 1A and FIG. 1B, by electrically connecting the terminals 61 of the semiconductor device 60 to the electrodes 46 of the semiconductor package 100 with the bonding wires 70, and by using the bottom surfaces 42 of the electrodes 46 as the outer terminals 47, connection to an external circuit becomes easier. Here the bonding wire 70 is a connecting wire between the semiconductor device 60 and the electrode 46, and various kinds of metals for wiring are available for the bonding wire 70.

The sealing resin 80 may be used to fix the semiconductor device 60 and the bonding wire 70, and to prevent intrusion of dust and water inward. Because the sealing resin 80 can fill up all spaces, the sealing resin 80 can also fill up a space around the tapering slope part 44 that becomes thinner at a lower part of the metal layer 40. When the sealing resin 80 hardens, the side surface 43 of the metal layer 40 is caught up by the sealing resin 80, which prevents the metal layer 40 from being pulled out downward from the sealing resin 80. Moreover, due to the tapered shape that becomes gradually thinner toward the bottom surface 42 of the metal layer 40, a border length between the metal layer 40 and the sealing resin 80 is longer than that in a case where the metal layer 40 has a vertical side surface 43, which can prevent the water intrusion and improve the humidity resistance.

FIG. 1B shows a bottom view of the semiconductor package 100 of the first embodiment. In the bottom surface of the semiconductor package 100, the outer terminal 47, which is the bottom surface 42 of the electrode 46, is exposed and a bottom surface of the semiconductor device mounting area 45 is also exposed.

Furthermore, FIG. 1B shows that the terminal 61 of the semiconductor device 60 and the top surface 41 of the electrode 46 are connected by the bonding wire 70. In this manner, the semiconductor package 100 makes it easier to handle the semiconductor device 60 by connecting the small terminal 61 of the semiconductor device 60 to the electrode 46 inside the semiconductor package 100 and by exposing the larger outer terminal 47 outside.

In FIG. 1A, a cross-sectional view of FIG. 1B along the line A-A is shown. As well as FIG. 1A, a cross-sectional view of FIG. 1B along the line B-B or C-C may also show the side surface 43 of the electrode 46 and the semiconductor device mounting area 45 as a shape of the bottom surface 42 which is shorter than the top surface 41 in width, including the tapered slope part 44. In other words, the semiconductor device mounting area 45 and electrode 46 may have side shapes including the slope part 44 not only in a traverse direction, but also in a longitudinal direction shown in FIG. 1B. In the following explanations of the embodiment, the explanations are given by citing an example of a side surface of transverse width, but the explanations are applicable to a side surface viewed from a longitudinal direction side in a similar way. Furthermore, since a decrease of a length as well as a decrease of width causes a decrease of circumference, one of the width and length or both of the width and length can be expressed by using a circumference. The expression of the "width" or "length" can be replaced by the "circumference".

Figure 2A:
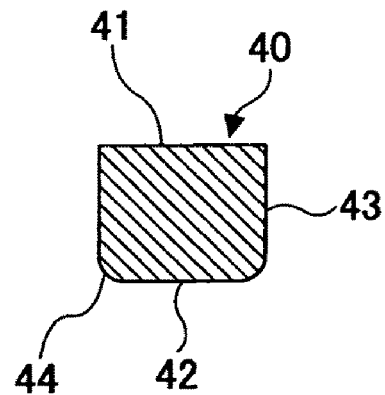
FIG. 2A is a side view showing an example of a shape of a metal layer.
Figure 2B:
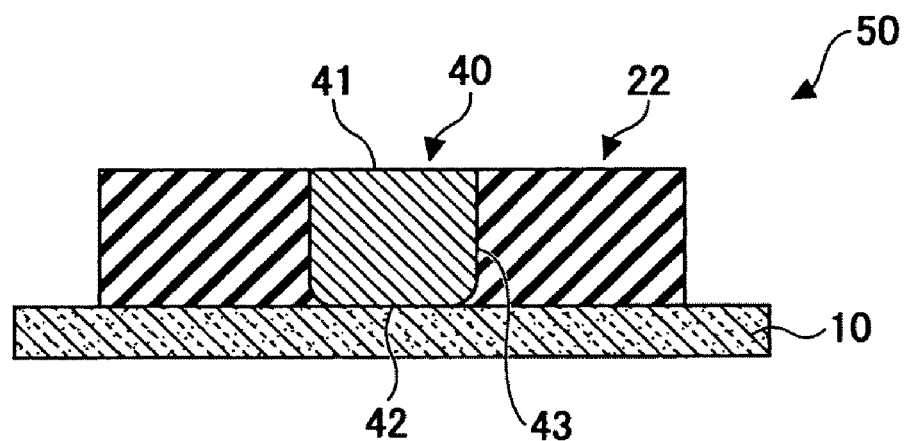
FIG. 2B is a view showing a plating process of a manufacturing process of a metal layer.

FIG. 2A and FIG. 2B are side views showing an example of a partial configuration of a substrate for a semiconductor package 50 of the first embodiment of the present invention.

FIG. 2A is a side view showing an example of a shape of the metal layer 40 described in the semiconductor package 100 in FIG. 1A and FIG. 1B. In FIG. 2A, the metal layer 40 has a bottom surface 42 the width of which is narrower than that of a top surface 41, and a side surface 43 including a slope part 44 that has a tapering shape carved inward near the bottom surface 42 lower than the middle level. By making the metal layer 40 into such a shape, when the sealing resin 80 described in FIG. 1A is supplied, the sealing resin 80 holds the side surface 43 of the metal layer 40 not only from a lateral direction but also from a lower part upward through the slope part 44. Therefore, the metal layer 40 has a shape to be able to prevent the metal layer 40 from being pulled out downward even if a downward force is applied from below. In addition, since the lower part of the metal layer 40 becomes gradually thinner, a border line between the metal layer 40 and the sealing resin 80 becomes longer compared to the vertically shaped metal layer of the conventional art, which can prevent intrusion of water and can improve humidity resistance.

FIG. 2B is a view showing an example of a plating process, one of processes of a manufacturing method of a substrate for a semiconductor package including the metal layer 40. In FIG. 2B, the metal layer 40 shown in FIG. 2A is formed on a substrate 10, surrounded by a resist pattern 22.

In this way, the semiconductor package 100 shown in FIG. 1A and FIG. 1B is manufactured by using a substrate for a semiconductor package 50 at first. Then, in the end, a bottom surface 42 of the metal layer 40 is exposed by removing the substrate 10. A removing method of the substrate 10 may be a method of dissolving the substrate 10 with a solvent that does not affect the sealing resin 80 other than the method of forcibly pulling the substrate 10 apart from the sealing resin 80. If the substrate 10 is removed by tearing, a downward force pulling the metal layer 40 attached to the substrate 10 acts in a tearing removal step. However, by making the metal layer 40 into a shape including the slope part 44 that is decreased in width and circumference toward the bottom as shown in FIG. 2B, the sealing resin 80 exists in a part between the slope part 44 and the substrate 10, surrounding an electrodeposition area of the metal layer 40 on the substrate 10. This can fix the metal layer 40 so as to hold the metal layer 40 from below.

The metal layer 40 having such a shape, for example, can be formed by using a resist pattern 22 as shown in FIG. 2B. More specifically, FIG. 2B shows a resist pattern 22 surrounding the metal layer 40. As shown in FIG. 2B, the resist pattern 22 is formed to have a hollow of which opening size decreases inward and downward. Then, by plating to fill the hollow formed on the exposed substrate 10 with the resist pattern 22, the metal layer 40 with a side surface including the slope part 44 carved inward can be formed. As shown in FIG. 2B, the side shape of the metal layer 40 can be completely controlled by the resist pattern 22. Furthermore, by plating in a thickness less than that of the resist pattern 22, a top surface 41 of the metal layer 40 can be formed evenly. In addition, because plating is not performed at a level over the resist pattern 22, the metal layer 40 can be formed thin, which can contribute to making the semiconductor package 100 thinner.

Thus, the substrate for a semiconductor package 50 of the first embodiment is manufactured by forming a metal layer 40 of which shape is controlled by using a resist pattern 22. Hereinafter, a concrete manufacturing method of the substrate for a semiconductor package 50 of the first embodiment is more specifically described.

FIG. 3A through FIG. 3G are views showing an example of a manufacturing method of a substrate for a semiconductor package 50 of the first embodiment of the present invention.

Figure 3A:
FIG. 3A is a first view of a manufacturing method of a substrate for the semiconductor package of the first embodiment showing a substrate.

FIG. 3A is a view showing a substrate 10.

The substrate 10 can be made of a variety of materials including metal as long as the materials have a conductive property. The substrate 10, for example, may be made of stainless or copper metals. Also, regarding the thickness of the substrate 10, a variety of thicknesses of the substrate 10 are available according to application. For example, a stainless-steel substrate 0.18 mm thick is available.

Figure 3B:
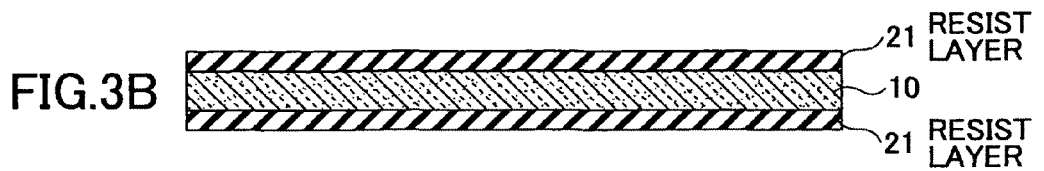
FIG. 3B is a second view of a manufacturing method of a substrate for the semiconductor package of the first embodiment showing a resist forming process.

FIG. 3B is a view showing a resist forming process to form resist layers 21 on both sides of the substrate 10. A variety of resists are available for the resist layer 21. For example, photo sensitive dry resist is available for the resist layer 21. Moreover, the thickness of the resist layer 21 can be arbitrarily set according to application. For example, the resist layer 21 on a top surface side of the substrate 10 may be about 75 µm thick, and the resist layer 21 on a bottom surface side of the substrate 10 may be about 25 µm thick. Furthermore, for example, photo resist used for lithographic exposure by light or electrons is available for the resist.

Figure 3C:
FIG. 3C is a third view of a manufacturing method of a substrate for the semiconductor package of the first embodiment showing a lithographic exposure process.

FIG. 3C is a view showing a lithography exposure process to expose the resist layer 21. In the lithography exposure process, the resist layer 21 is covered with a glass mask 30 where a predetermined mask pattern is formed and irradiated with light; and then, the mask pattern is transferred into the resist layer 21. A negative type resist that decreases its solubility and hardens when exposed, and leaves an exposed part in developer, may be available for the resist. Also, a positive type resist that increases its solubility when exposed, an exposed part of which dissolves in developer, may be available for the resist. In FIG. 3C through FIG. 3G, an example using the negative type resist is explained.

In FIG. 3C, because a resist pattern is formed into the resist layer 21 on the top surface side, and a resist pattern is not formed into the resist layer 21 on the bottom surface side, the top surface is exposed with a glass mask 30, and the bottom surface is directly exposed without a glass mask 30. If a positive type resist is used, exposure should be performed from the top side with a glass mask 30 having a reverse pattern to the negative type resist, without exposure from the bottom surface.

The glass mask 30 includes a predetermined mask pattern 31. For example, the mask pattern 31 is formed into the glass mask 30 by forming a light shielding part 38 made of a light shielding film on a glass substrate 37. The mask pattern 31 is formed as a pattern including a glass substrate exposed part for an area where the resist layer 21 is left and the light shielding part 38 for an area where the resist layer 21 is not left. A concrete configuration of the mask pattern 31 of the glass mask 10 used in FIG. 3C is described below.

Here an exposure energy amount for the top surface is desired to be 70-85% of a rated exposure energy amount for the negative resist. As mentioned above, details of the mask pattern 31 of the glass mask 30 are described below, but in the embodiment, in order to form a resist pattern 22 with a side shape described in FIG. 2B, the mask pattern 31 needs a specific configuration in a border area between the shielding part 38 of the glass mask 30 and the glass substrate 37 exposed part. The mask pattern 31 in the border area including the specific configuration is provided to adjust transmittance of the border area, but there is a concern that the specific configuration be transferred to the resist layer 21 without modification if the exposure is performed in the rated exposure energy amount. Hence, it is desirable to perform the exposure at a lesser exposure energy amount than the rated exposure energy amount, in order to make the border area between the light shielding part 38 and the glass substrate 37 in the glass mask 30 have an intermediate transmittance between the light shielding part 38 and the glass substrate 37, and to form a desired resist pattern 22.

Figure 3D:
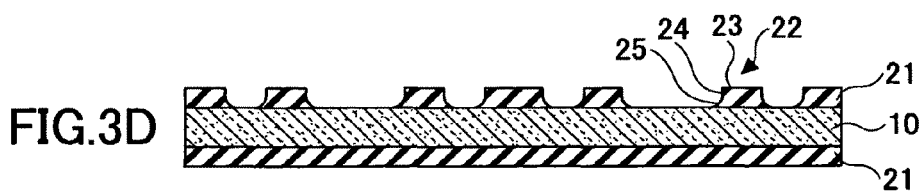
FIG. 3D is a fourth view of a manufacturing method of a substrate for the semiconductor package of the first embodiment showing a developing process.

FIG. 3D is a view showing a development process to form the resist pattern 22 into the resist layer 21. In the development process, the substrate 10 covered with the resist layer 21 after the exposure is immersed in developer, an unnecessary part of the resist layer 21 is removed, and the resist pattern 22 is formed. Various kinds of developers can be used according to application. For example, sodium carbonate solution may be used as the developer.

During the development, it is possible to immerse the substrate 10 in the developer facing the resist pattern formation surface downward, to throw a jet of the developer from below toward the resist pattern formation surface with a nozzle or the like, and to hit the resist pattern formation surface with the jet of the developer. By providing the developer to the resist pattern formation surface in this manner, it is possible to prevent stagnation of the developer on the resist pattern formation surface and to prevent a poor resist pattern formation by over-development. Also, in this case, since a non-resist pattern formed surface lies at a top surface, removal of the resist layer 21 by the development is not carried out about the top surface. Moreover, because the non-resist pattern formed surface is flat, it is possible to readily remove the developer from the non-resist pattern formed surface and to quickly dry the non-resist pattern formed surface after the development.

Regarding a general developing time, when a material surface is observed by eye, if a time when a resist residue is completely removed is made a minimum developing time t0 seconds, and an actual developing time is made t1 seconds, a developing time coefficient K is expressed as K=t1/t0. In general, the actual developing time t1 seconds is determined so that the developing time coefficient K equals 1.5 to 2.0 if the substrate 10 is made of copper (Cu), and the developing time coefficient K equals 1.2 to 1.6 if the substrate 10 is made of stainless. The developing time coefficient K of copper is more than 1.5, which is a relatively high value. This is because a safety margin is taken into account to completely remove an unnecessary part of the resist layer 21, considering variation of developing devices and developing conditions. Moreover, the developing time coefficient K of stainless is less than that of copper because resist adhesion of stainless is inferior to that of copper.

However, in the manufacturing method of the substrate for a semiconductor package 50 of the embodiment, it is desirable to determine the actual developing time t1 seconds so that the developing time coefficient K is in a range of 1.10 to 1.30 if the substrate 10 is made of copper; and the developing time coefficient K is in a range of 1.03 to 1.09 if the substrate 10 is made of stainless because the resist pattern formation defect rate increases if the developing time is too long or too short. This is because, as mentioned above, since the border area between the shielding part 38 of the glass mask 30 and the exposed part of the glass substrate 37 needs an intermediate transmittance between the light shielding part 38 and the exposed part of the glass substrate 37, the exposure is performed under the conditions, and the curing degree of the resist layer 21 in the border area also becomes an intermediate value between the light shielding part 38 and the exposed part of the glass substrate 37. In other words, according to the general developing time coefficient K described above, the border area becomes over-developed, and the resist pattern formation defect rate increases. Thus, in the manufacturing method of the substrate for a semiconductor package 50 of the embodiment, it is desirable to set the developing time coefficient K to be more than 1.00, and to be less than the lower limit of a range of the developing time coefficient K in a general development process.

By the development process, the resist pattern 22 is formed on the top surface of the substrate 10, and the top surface of the substrate 10 includes a part of the remaining resist pattern 22 and an exposed part of the substrate 10. The bottom surface of the substrate 10 is still covered with resist layer 21.

The formed resist pattern 22 becomes a shape of which side surface 24 includes a slope part 25 that extends downward and outward. More specifically, the top surface 23 of the resist pattern 22 and the bottom surface in contact with the substrate 10 differ in shape, and the resist pattern 22 has a shape the bottom surface of which expands in a transverse direction. The slope part 25 has a shape decreasing in hollow circumference as the hollow circumference approaches the bottom surface, e.g. the substrate 10. The shape agrees with the shape of the resist pattern 22 described in FIG. 2B. Therefore, in the development process of the manufacturing method of the substrate for a semiconductor package 50 of the first embodiment, the resist pattern 22, like a mountain, including a side surface 24 that flares out at the bottom is formed.

Figure 3E:
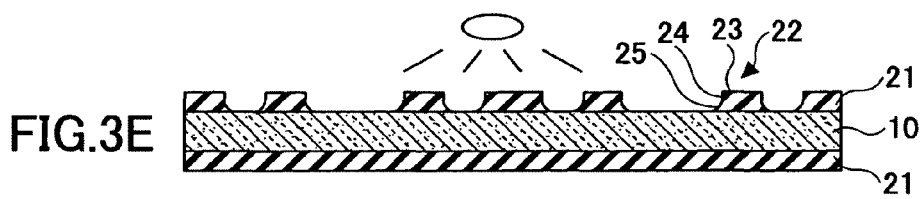
FIG. 3E is a fifth view of a manufacturing method of a substrate for the semiconductor package of the first embodiment showing a resist pattern stabilization process.

FIG. 3E is a view showing a resist pattern stabilization process. The resist pattern stabilization process is a process provided as necessary, in order to stabilize the resist pattern 22 after the resist pattern 22 formation. In the resist pattern stabilization process, after the resist pattern 22 is formed, the surface on which the resist pattern 22 is formed is exposed again, and the side surface 24 of the intermediate curing degree is fully hardened. This stabilizes the shape of the side surface 24 of the resist pattern 22 including the slope part 25, which makes it possible to perform the following processes by using a resist pattern 22 of which shape is fixed. Regarding a surface on which the resist pattern 22 is not formed, since a resist layer 21 has already fully hardened, the exposure is not needed.

Moreover, an exposure energy amount in the resist pattern stabilization process is desired to be in a range of 80 mJ/cm$^2$ to 120 mJ/cm$^2$. This makes it possible to fully harden the resist layer 21 exposed in the border area between the light shielding part 38 of the mask pattern 31 and the exposed part of the glass substrate 37, and to certainly stabilize the shape of the side surface 24 of the resist pattern 22.

The resist pattern stabilization process can be called an after-development lithography exposure process because the resist pattern stabilization process is a lithography exposure process performed after the development. Furthermore, the resist pattern stabilization process can be carried out as necessary, according to a resist pattern condition after the development, process cost, and required specifications.

According to the resist pattern stabilization process of the embodiment, even if the side surface of the resist pattern 22 has an insufficient curing degree after exposed by the intermediate transmission area of the mask pattern 31, it is possible to harden the resist pattern 22 enough, and then to perform a plating process after stabilizing the resist pattern 22.

Figure 3F:
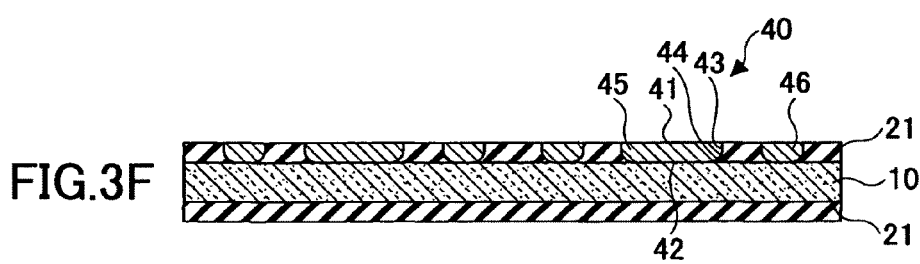
FIG. 3F is a sixth view of a manufacturing method of a substrate for the semiconductor package of the first embodiment showing a plating process.

FIG. 3F is a view showing a plating process. In the plating process, an exposed part of the substrate 10 is filled with metal material according to the shape of the resist pattern 22, and the metal layer 40 is formed. The plating may be performed by immersing the substrate 10 on which the resist pattern is formed in plating solution, then connecting the substrate 10 to a cathode and placing an anode to face the substrate 10, and performing electroplating. The metal material used for the plating, for example, may be made of not only one such as gold, but may include plural kinds of materials. In this case, for example, by performing plural plating operations with different plating solutions, plating by stacking plural kinds of metal materials can be carried out. For example, from the substrate 10 side, by plating gold (Au) in 0.1 mm film thickness at first, next by plating nickel (Ni) in 50 µm film thickness, and finally by plating gold again in 0.3 µm thickness, the plating process can be executed. This makes it possible to utilize advantages of each of the metal materials and to perform high-quality plating.

In the plating, since the metal material is electrically deposited on a exposed part of the substrate 10 according to the shape of the resist pattern 22, the metal layer 40 including a top surface 41, the circumference of which is greater than that of a bottom surface, and including a cupped side surface shape including a slope part 44 where a side surface 43 expands from the bottom surface 42 to the top surface 41, is formed in accordance with the shape of the resist pattern 22. By doing this, when a semiconductor package 100 is manufactured by the substrate for a semiconductor package 50, because the sealing resin 80 wraps an area under the metal layer 40 around, even if a downward force acts on the metal layer 40 from below, by fixing the sloped side surface 43 or by providing an upward force, resisting the downward force from below becomes possible.

It is desirable to make the thickness of the plated metal layer 40 less than the thickness of the resist pattern 22. This allows the top surface 41 of the metal layer 40 to be formed as a flat surface, and the top surface and the size of each of semiconductor device mounting areas 45 and electrodes 46 to be uniform. Due to this, when a semiconductor device 60 is mounted on the semiconductor device mounting area 45 or wire bonding is performed on the electrode 46, it is possible to make certain the adhesion or connection and to decrease product variation of the substrates for a semiconductor package 50.

More specifically, if plating is performed over a thickness of the resist pattern 22 like the conventional art disclosed in Patent Document 1, the top surface 41 cannot be controlled because the metal overflows out of the resist pattern 22 and expands transversely on the resist pattern 22. Furthermore, since the length of expanding transversely differs among the metal layers 40, the size of the semiconductor device mounting areas 45 or the electrodes 46 becomes non-uniform. From this aspect, according to the manufacturing method of the substrate for a semiconductor package 50, the top surface 41 of the semiconductor device mounting area 45 and electrode 46 can be flat and have a uniform shape and size. In addition, because the semiconductor device mounting area 45 and electrode 46 become lower than the thickness of the resist pattern 22, it is possible to shape the semiconductor device mounting area 45 and electrode 46 thinner than those in the conventional art.

Figure 3G:
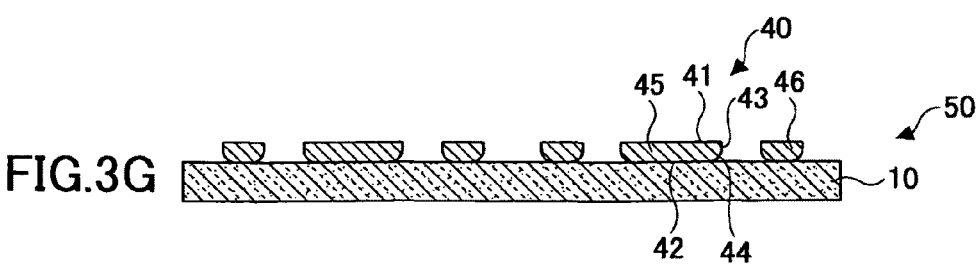
FIG. 3G is a seventh view of a manufacturing method of a substrate for the semiconductor package of the first embodiment showing a resist removal process.

FIG. 3G is a view showing a resist removal process to remove the resist pattern 22. In the resist removal process, the process can be carried out by using an appropriate etching solution to remove the used resist, and by immersing the plated substrate 10 in the etching solution. For example, if the dry film resist described in FIG. 3B is used as the resist layer 21, 5% caustic soda is available for the etching solution.

In the resist removal process, the resist pattern 22 is removed, and the substrate for a semiconductor package 50, which is the substrate 10 on which the semiconductor device mounting areas 45 and electrodes 46 are formed, is completed. Each of the semiconductor device mounting areas 45 and electrodes 46 have a top surface 41 larger than a bottom surface 42 and a side surface 43 including a slope part 44 of which circumference expands from the bottom surface 42 to the top surface 41. More specifically, if a semiconductor package 100 is manufactured by using the substrate for a semiconductor package 50, the metal layer 40 has a shape that makes it difficult to be pulled out because the metal layer 40 has a slope surface that can resist a downward force by the sealing resin 80 wrapping around an area under the metal layer 40. Moreover, because the semiconductor device mounting areas 45 and electrodes 46 are configured as metal layers 40 that have a uniform size and height, each of which has a flat top surface 41, the substrate for a semiconductor package 50 is a high-accuracy substrate that can be sufficiently adapted to miniaturization of interconnections.

Next, more detailed explanation is given about the lithography exposure process in the manufacturing method of the substrate for a semiconductor package 50 of the first embodiment by using FIG. 4 through FIG. 10.

FIG. 4 is a view for explaining an example of a relationship between the glass mask 30 used in the lithography exposure process and the resist pattern 22. In FIG. 4, as the glass mask 30 used for the lithography exposure, a glass mask 30 including an intermediate transmittance area of 30% other than a 0% transmittance area and a 100% transmittance area is shown.

The 100% transmittance area is a transmission area where a glass substrate 37 is exposed. A resist layer 21 is irradiated with light emitted by the lithography exposure at 100%. In the 100% transmittance area, light curing photo resist fully hardens due to the 100% transmitting irradiation light. In contrast, the 0% transmittance area is a shielding area that blocks off and does not let through the light emitted by the lithography exposure, and is an area where a shield part 38 is formed on the glass substrate 37. In the 0% transmittance area, since the resist layer 21 does not harden, the resist layer 21 is removed in the development process and the substrate 10 is exposed.

On the other hand, as shown in FIG. 4, in the intermediate transmittance area of 30% transmittance, only a part of the resist layer 21 hardens. Because the 30% transmittance area is sandwiched between the 0% transmittance area and the 100% transmittance area, the 30% transmittance area is influenced by the transmittances of both areas. As a result, the 30% transmittance area does not have a complete step-like 30% transmittance. As shown in FIG. 4, the resist layer 21 becomes a shape including the slope part 25 where a hardened part gradually increases from the 0% transmittance area to the 100% transmittance area. By forming the resist pattern 22 into the resist layer 21 including such a shape, and by performing plating with metal material to fill the resist pattern 22, it is possible to form the metal layer 40 that has the bottom surface 42 which is less than the top surface 41 in width and circumference and has the side surface 43 including the slope part 44 to connect a width of the top surface 41 and that of the bottom surface 42 in lines.

In this way, by setting the transmittance of the glass mask 30 at an intermediate transmittance between 0% and 100%, it is possible to form the resist pattern 22 extending outward and downward as shown in FIG. 4. A value of the intermediate transmittance between 0% and 100% can be set at various transmittance values according to an intended purpose.

Such an intermediate transmittance between 0% and 100% can be realized in various ways, for example, by adjusting transmittance of a light shielding film by changing color or materials, or by making a tinting part into the glass substrate 37 of the glass mask 30.

Next, by using FIG. 5A through FIG. 10, an explanation is given about a method of materializing an intermediate transmittance between 0% and 100% by a mask pattern 31. In the above-mentioned transmittance adjustment by changing color or materials of the light shielding film, or by the tinted glass substrate 37, there is a concern that complicated work is needed and the adjustment is difficult to practice. Hence, in the manufacturing method of the substrate for a semiconductor package 50 of the embodiment, more detailed explanations are given about a manufacturing method capable of materializing the above-mentioned transmittance and resist pattern 22 by the shape of a mask pattern 31, without changing materials of the light shielding part 38 and the glass substrate 37.

Figure 5A:
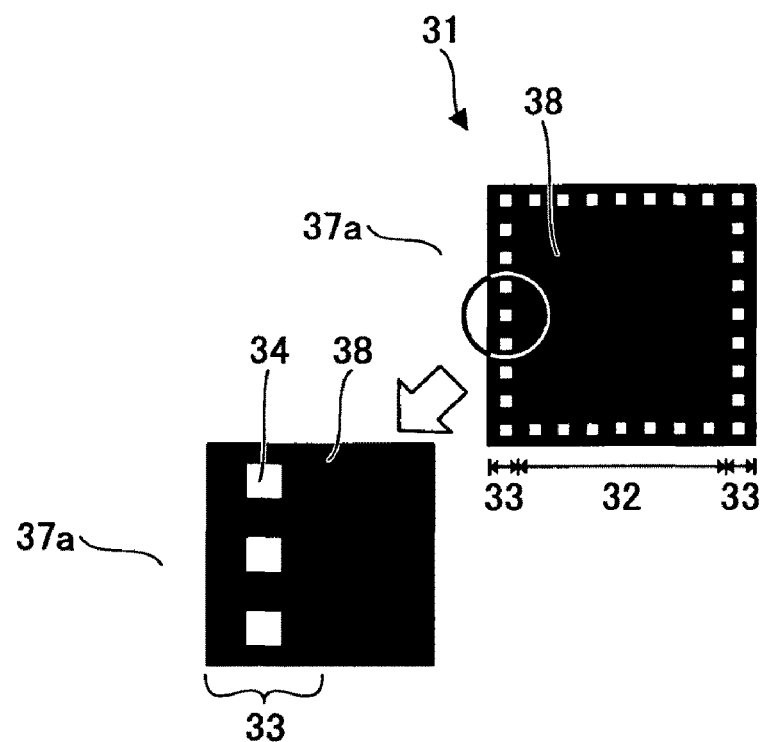
FIG. 5A is a top view showing an example of a mask pattern in a lithographic exposure process in the first embodiment.
Figure 5B:
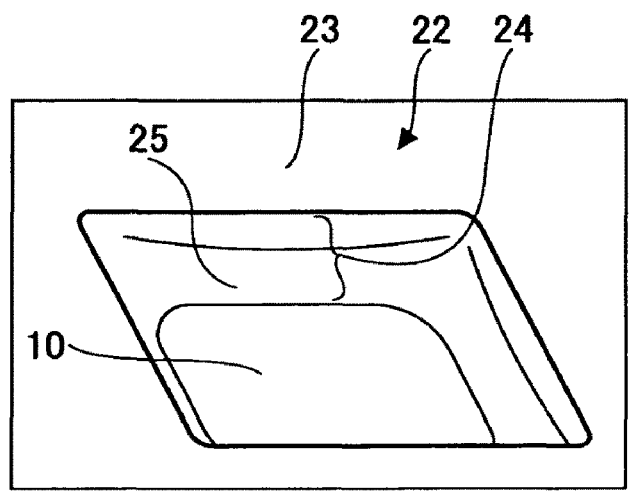
FIG. 5B is a view showing an example of a resist pattern formed by using the mask pattern of FIG. 5A.

FIG. 5A and FIG. 5B are views showing an example of the shape of a mask pattern 31 of the glass mask 30 used for a lithography exposure process of the manufacturing method of the substrate for a semiconductor package 50 of the first embodiment. FIG. 5A is a view showing an example of a top view of the mask pattern 31 of the glass mask 30.

In FIG. 5A, the mask pattern 31 includes a transmission area 37a, an intermediate transmission area 33 and a light shielding area 32. The transmission area 37a is an area where the glass substrate 37 is exposed and light passes through. When the resist pattern 22 is formed with a negative type resist layer 21, the mask pattern 31 is mostly made of the transmission area 37a that leaves the resist layer 21, and includes the light shielding area 32 and the intermediate transmission area 33 at a position intended to form an opening. The mask pattern 31 is configured to include the intermediate area 33 between the transmission area 37a and the light shielding area 32.

The light shielding area 32 is an area where the glass substrate 37 is fully covered with the light shielding part 38, and becomes a quadrangle formed with the light shielding part 38. On the other hand, the intermediate transmission area 33 is an area near a border with the transmission area 37a, and plural transmission parts 34 are partially provided in an area made of the light shielding part 38, and the light shielding part 38 and the transmission parts 34 exist in a mixed state. This allows the intermediate area 33 to partially let the light through. Thus, for example, adjustment of the transmittance may be carried out by partially disposing the transmission parts 34 so that the transmittance of the intermediate transmission area 33 of the mask pattern 31 becomes higher than that of the light shielding area 32 among the whole mask pattern 31. From a micro perspective, a part where the light shielding part 38 is formed has 0% transmittance, and a part where the glass substrate 37 is exposed has 100% transmittance. However, as described in FIG. 4, because the intermediate transmission area 33 is disposed between the light shielding area 32 of 0% transmittance and the transmission area 37a of 100% transmittance made of the exposed glass substrate 37 surrounding the mask pattern 31, the intermediate transmission area 33 is affected by the transmittances on both sides, and the resist layer 21 under the intermediate transmission area 33 becomes a shape including the slope part 25. Therefore, without intricately adjusting materials themselves such as the glass substrate 37 and the light shielding part 38, by configuring the glass mask 30 to include the transmission part 34 made of the same material as the transmission area 37a, and the light shielding part 38 made of the same material as the light shielding area 32 in a mixed state, it is possible to form the intermediate transmission area 33 of which transmittance is lower than that of the transmission area 37a and is higher than that of the light shielding part 38. Furthermore, by using the glass mask 30 including such a mask pattern 31, the resist pattern 22 that includes the slope part 25 and expands outward and downward can be formed, as shown in FIG. 4.

FIG. 5B is a view showing an example of a resist pattern 22 formed by a lithography exposure process by using the glass mask 30 including the mask pattern 31 shown in FIG. 5A. In FIG. 5B, the whole resist pattern 22 forming a hollow part shows the resist pattern 22 formed by the glass mask 30 including the mask pattern 31 of the shape of FIG. 5A. The resist pattern 22 including a flat top surface 23 remains corresponding to the exposed part of the glass substrate 37 of the mask pattern 31. A lower part of a circumference part corresponding to the intermediate transmission area 33 of the mask pattern 31 expands inward and downward in the hollow part, and has the side surface 24 including the slope part 25 that makes a circumference of the hollow part gradually smaller. In a part corresponding to the light shielding area 32 of the mask pattern 31, the substrate 10 is exposed.

In this way, it is possible to form the resist pattern 22 that has the side surface 24 including the slope part 25 by partially disposing plural transmission parts 34 and making the intermediate transmission area 33 including the light shielding part 38 and the transmission part 34 in a mixed state. Because the intermediate transmission area 33 is disposed between the transmission area 37a of 100% transmittance where the light shielding part 38 is not formed at all and the light shielding area 32, the whole surface of which is fully covered with the light shielding part 38, it is possible to form the side surface 24 including the slope part 25 by the influence of both of the transmittances with the glass mask 30 of simple configuration. Though the side surface 24 expands inward and downward of the resist pattern 22 forming the hollow part, and has the slope part 25 of which circumference decreases, seen from the resist pattern 22 where resist remains, since the slope part 25 expands downward and outward, the explanation does not contradict the above-discussed description.

Figure 6A:
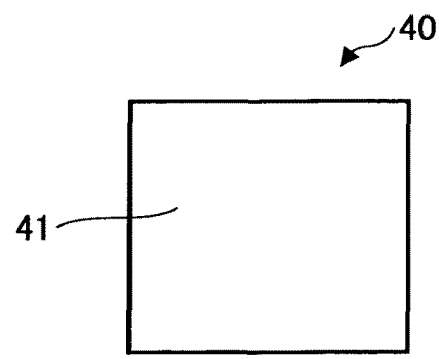
FIG. 6A is a view showing an example of top surface of a metal layer formed by using a resist pattern.
Figure 6B:
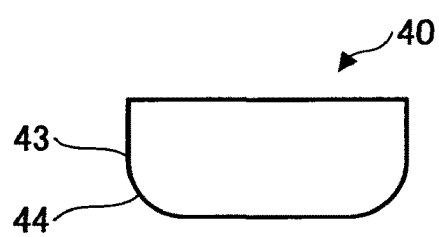
FIG. 6B is a view showing an example of side surface of a metal layer formed by using a resist pattern.
Figure 6C:
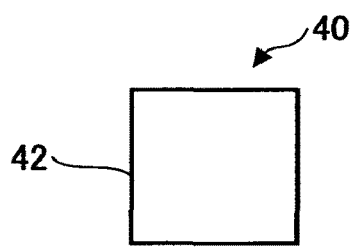
FIG. 6C is a view showing an example of a bottom surface of a metal layer formed by using a resist pattern.
Figure 6D:
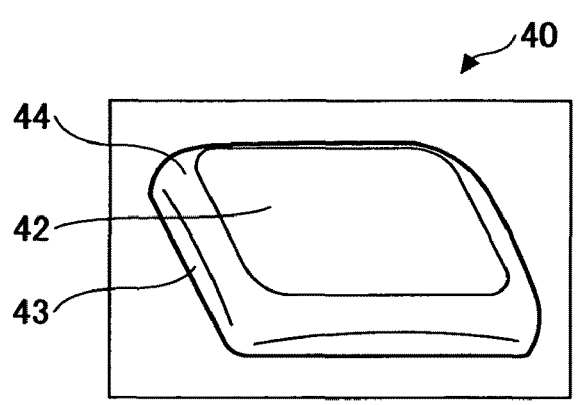
FIG. 6D is a perspective view showing an example of a cubic figure of a vertically inverted metal layer.

FIG. 6A through FIG. 6D are views showing an example of the metal layer 40 formed by plating with the resist pattern 22 shown in FIG. 5B. FIG. 6A is a view showing an example of the top surface 41 of the metal layer 40. FIG. 6B is a view showing an example of a cross section of the side surface 43 of the metal layer 40. FIG. 6C is a view showing an example of the bottom surface 42 of the metal layer 40. FIG. 6D is a view showing an example of a three-dimensional shape reversed vertically.

As shown in FIG. 6A through FIG. 6C, the metal layer 40 formed by plating has the top surface 41 of which perimeter or cross-section area parallel to the substrate 10 is greater than that of the bottom surface 42. The side surface 43 is configured to include the slope part 44 where a circumference or a cross-section area at a level parallel to the substrate 10 decreases at a lower part than at the middle of the side surface 43 as the level approaches the substrate 10 or the bottom 42. This makes it possible to prevent the metal layer 40 from being pulled out because sealing resin 80 wraps around an area under the metal layer 40, and a force to fight back a downward shift acts on the metal layer 40 via the slope part 44 formed around the bottom surface 42 when a semiconductor package is manufactured by using the substrate for a semiconductor package 50 of the embodiment of the present invention.

Furthermore, in FIG. 6D, a three-dimensional oblique perspective view of the vertically inverted metal layer 40 is shown. According to a configuration of the metal layer 40, even if the metal layer 40 is pulled upward, a downward resistant force acts on the metal layer 40 by wrapping around the slope part 44 near the bottom surface 42 (which is shown at a top side in FIG. 6D) of the side surface 43 with the sealing resin 80.

Next, an explanation is given about various kinds of configuration examples of the mask pattern 31 of the glass mask 30 in the manufacturing method of the substrate for a semiconductor package 50 of the first embodiment using FIG. 7 through FIG. 10.

Figure 7:
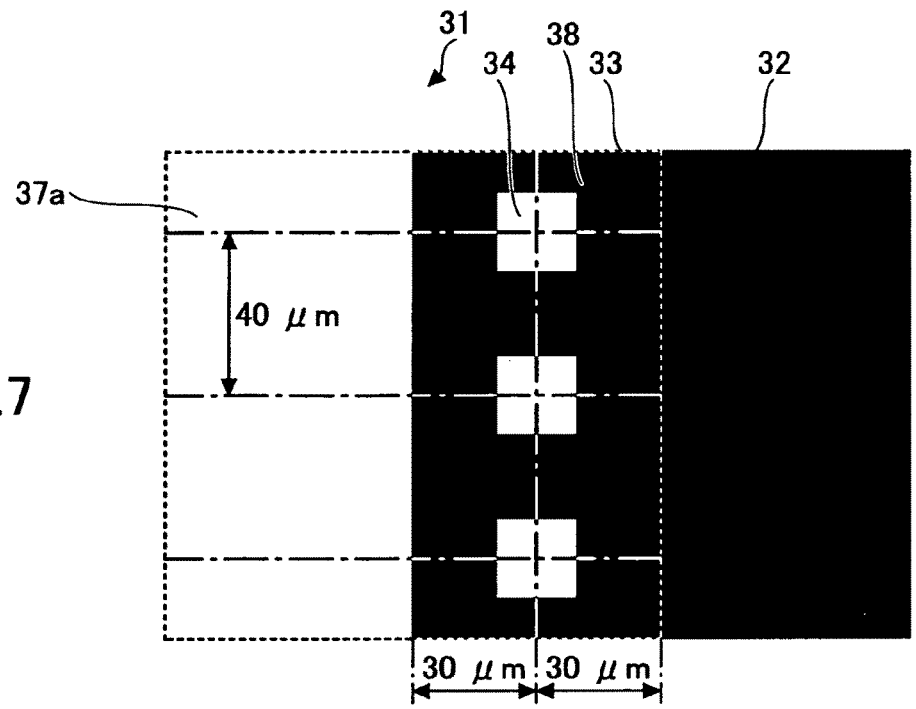
FIG. 7 is a view showing an example of a mask pattern in the manufacturing method of a substrate for a semiconductor package of the first embodiment.

FIG. 7 is an enlarged view showing a same mask pattern as the mask pattern 31 of the glass mask 30 in the manufacturing method of the substrate for a semiconductor package 50 of the first embodiment described until now. In FIG. 7, the mask pattern 31 includes the intermediate transmission area 33 between the transmission area 37a where the glass substrate 37 is exposed and the light shielding area 32 where the glass substrate 37 is wholly covered with a light shielding film. Also, the intermediate transmission area 33 of the mask pattern 31 includes the partial transmission part 34 that is partially formed in the light shielding part 38. In FIG. 7, if the breadth of the intermediate transmission area 33 is 60 μm, the partial transmission part 34 is a square 20 μm on a side, and is formed so that a median point passes through the middle point of the intermediate transmission area 33 in a transverse direction. Moreover, the pitch of the adjacent partial transmission parts 34 in a longitudinal direction is 40 μm. Thus, for example, it is possible to form the partial transmission part 34 that has about a one-third width of the intermediate transmission area 33. Since a light shielding film part outer to the partial transmission part 34 is 20 μm, and the partial transmission part 34 is 20 μm, transmittance of a whole intermediate transmission area 33 is properly adjusted.

Figure 8:
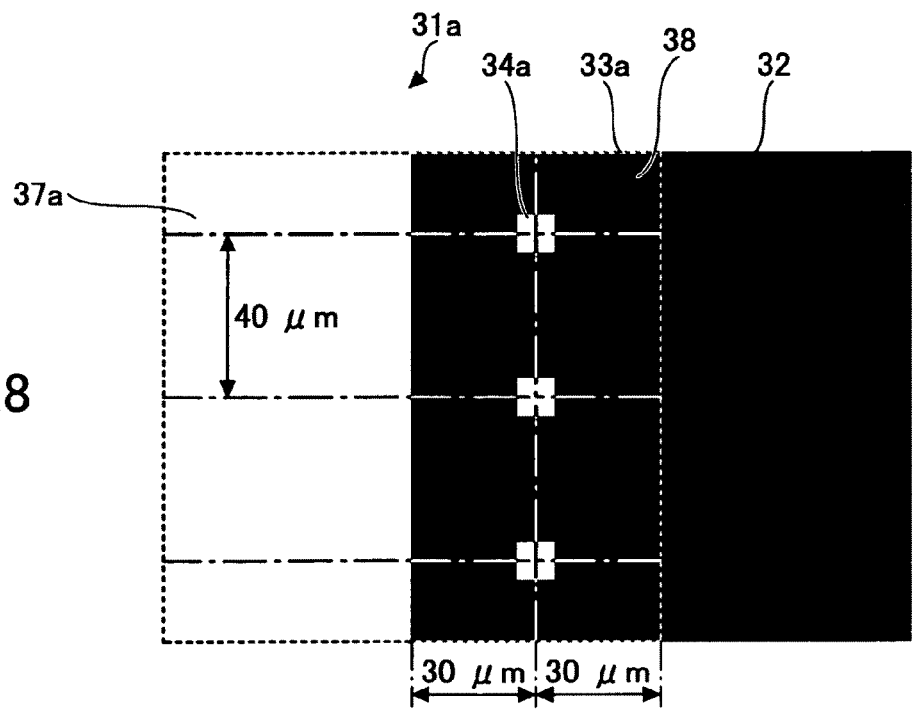
FIG. 8 is a view showing a first modified example of a mask pattern in the manufacturing method of a substrate for a semiconductor package of the first embodiment.

FIG. 8 is a view showing a mask pattern 31a of a first modified example. FIG. 8 shows an example where an arrangement of a partial transmission part 34a is similar to the mask pattern 31 in FIG. 7, but the size of the partial transmission part 34a is different from the mask pattern in FIG. 7. In FIG. 8, the partial transmission part 34a is disposed on the middle line of the intermediate transmission area 33a that has a width of 60 μm so that the median points of the partial transmission parts 34a agree with each other, and the pitch of the adjacent partial transmission parts 34a is 40 μm in a longitudinal direction. Accordingly, the layout relationship of the partial transmission part 34a in the mask pattern 31a is similar to the mask pattern 31 in FIG. 7. However, in FIG. 8, a side of the partial transmission part 34a is 10 μm, which is a half of a side of the partial transmission part 34 in FIG. 7. Thus, a size of the partial transmission part 34, 34a can be made an appropriate size according to application.

Figure 9:
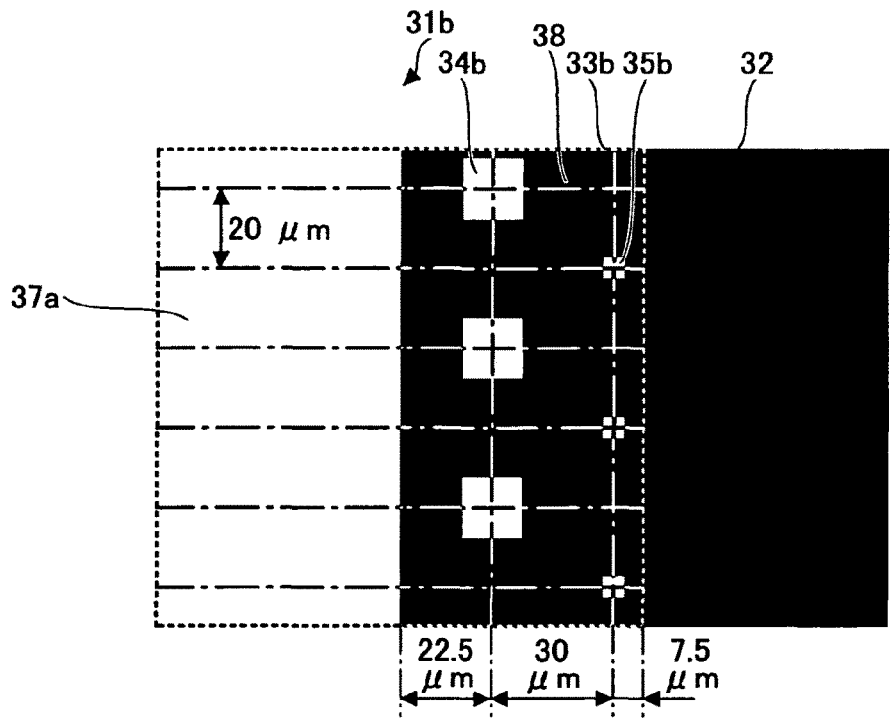
FIG. 9 is a view showing a second modified example of a mask pattern in the manufacturing method of a substrate for a semiconductor package of the first embodiment.

FIG. 9 is a view showing a mask pattern 31b of a second modified example. FIG. 9 shows an example of the mask pattern 31b that has a partial transmission part 34b, 35b pattern different from the mask pattern 31 in FIG. 7 and the mask pattern 31a in FIG. 8. The mask pattern 31b in FIG. 9 differs from the mask pattern 31, 31a in FIG. 7 or FIG. 8 in that there are plural kinds of partial transmission parts 34b, 35b, of which sizes are different in an area of the light shielding part 38 of the intermediate transmission area 33b.

In FIG. 9, regarding the size of the intermediate transmission area 33b, the width is 60 μm that is the same as FIG. 7 and FIG. 8, but the first partial transmission parts 34b of a square 15 μm on a side are centered at a position of 22.5 μm from a border line with a transmission area 37a at 40 μm pitch in a longitudinal direction. Furthermore, second partial transmission parts 35b of a square 5 μm on a side are centered at a position of 55.5 μm from the outer circumference in a transverse direction and at a position in the middle of the adjacent first partial transmission parts 34b at 40 μm pitch in a longitudinal direction. In other words, the first partial transmission parts 34b that have a longer side are disposed on a transmission area 37a side in the intermediate transmission area 33b, and the second partial transmission parts 35b are disposed on a light shielding area 32 side, and the first partial transmission parts 34b and the second partial transmission parts 35b are disposed alternately in a longitudinal direction.

In this way, it is possible to configure the mask pattern 31b by partially disposing plural kinds of partial transmission parts 34b, 35b in an area of the light shielding part 38 of the intermediate transmission area 33b. By disposing the partial transmission parts 34b, 35b on the transmission area 37a side and the light shielding part 38 side of the intermediate transmission area 33b, and by fine-tuning the transmittance, it is possible to adjust the slope 25 of the side surface 24 of the resist pattern 22 with a high degree of accuracy.

Figure 10:
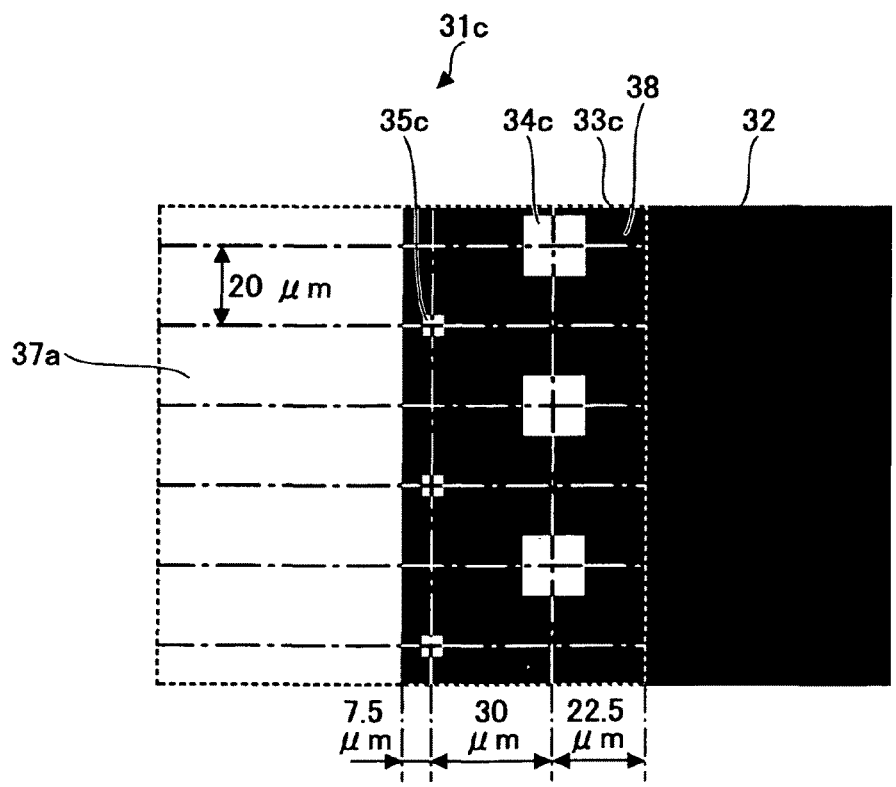
FIG. 10 is a view showing a third modified example of a mask pattern in the manufacturing method of a substrate for a semiconductor package of the first embodiment.

FIG. 10 is a view showing a mask pattern 31c of a third modified example. The mask pattern 31c of the third modified example is similar to the mask pattern 31b of the second modified example in that there are plural kinds of partial transmission parts 34c, 35c in the area of the light shielding part 38. However, a layout pattern of the mask pattern 31c of the third modified example differs from the mask pattern 31b in the second modified example.

In FIG. 10, an intermediate transmission area 33c has a width of 60 μm as well as the mask pattern 31, 31a, 31b described above. Also, the mask pattern 31c of the third modified example is similar to the mask pattern 31b in FIG. 9 in that a side length of the first partial transmission part 34c with a longer side is 15 μm long, a side length of the second partial transmission part 35c with a shorter side is 5 μm long, and the first partial transmission part 34c and the second partial transmission part 35c are alternately arranged at 40 μm pitch in a longitudinal direction.

However, in FIG. 10, the mask pattern 31c differs from the mask pattern 31b of the second modified example in FIG. 9 in that the second partial transmission parts 35c that have shorter sides are disposed at 7.5 μm from a border line between the intermediate transmission area 33c and the transmission area 37a on the transmission area 37a side, and the first partial transmission parts 34c that have longer sides are disposed at 37.5 μm from the border line between the intermediate transmission area 33c and the transmission area 37a on the light shielding area 32 side.

In this way, even when plural kinds of partial transmission parts 34b, 35b, 34c, 35c are formed in an area of the light shielding field 38 in the intermediate transmission area 33b, 33c, the arrangements are changeable according to application.

As described in FIG. 7 through FIG. 10, side surfaces 24 connecting between the top surface 23 and the substrate 10 surface are adjustable so as to have various slope widths and slope angles based on a configuration of the mask patterns 31, 31a to 31c of the glass mask 30, and various shapes of metal layers 40 can be formed according to application.

According to the mask patterns 31, 31a to 31c in the first embodiment, it is possible to adjust the transmittances of the intermediate transmission areas 33, 33a to 33c by adjusting a ratio between the transmission part and the light shielding part by changing a mask pattern shape. More specifically, it is possible to adjust the transmittance of the intermediate transmission area 33, 33a to 33c by a size or number of openings, and to perform a flexible transmittance adjustment despite a simple configuration.

Figure 11A:
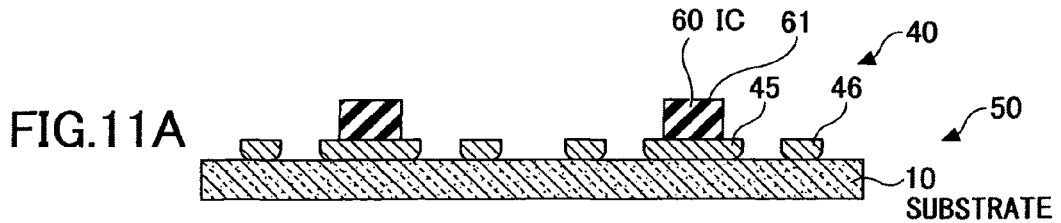
FIG. 11A is a first view of a manufacturing method of a semiconductor package of the first embodiment showing a semiconductor device mounting process.
Figure 11B:
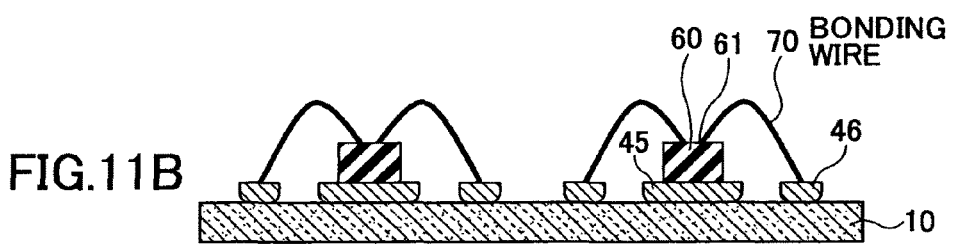
FIG. 11B is a second view of a manufacturing method of a semiconductor package of the first embodiment showing a wire bonding process.
Figure 11C:
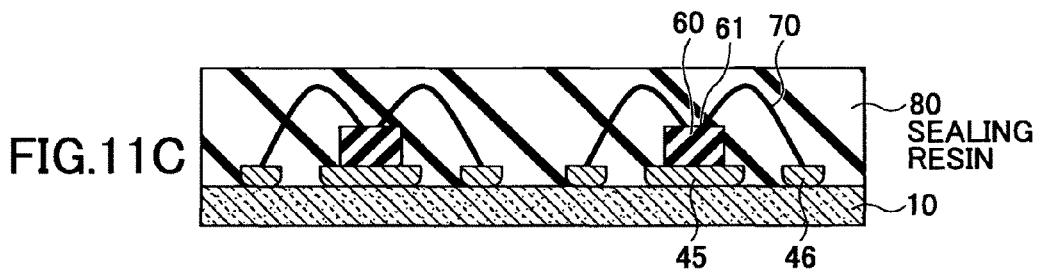
FIG. 11C is a third view of a manufacturing method of a semiconductor package of the first embodiment showing a resin sealing process.
Figure 11D:
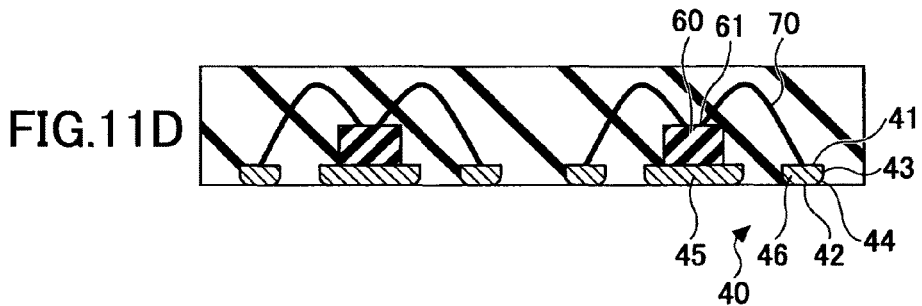
FIG. 11D is a fourth view of a manufacturing method of a semiconductor package of the first embodiment showing a substrate removal process.
Figure 11E:
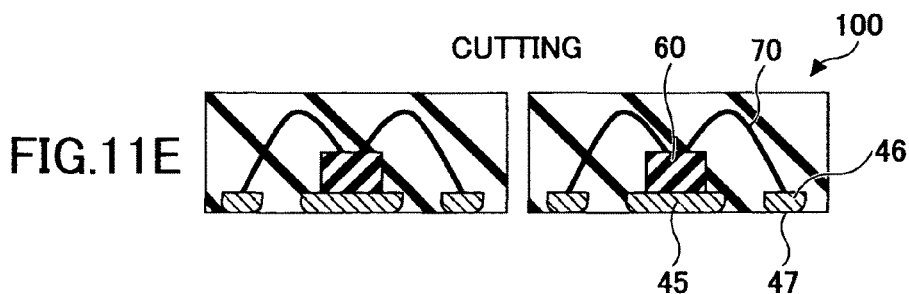
FIG. 11E is a fifth view of a manufacturing method of a semiconductor package of the first embodiment showing a dividing process.

Next, an explanation is given about an example of a manufacturing method of the semiconductor package 100 by using the substrate for a semiconductor package 50 of the first embodiment with reference to FIG. 11A through FIG. 11E. FIG. 11 through FIG. 11E are views showing an example of the manufacturing method of the semiconductor package 100 of the first embodiment.

FIG. 11A is a view showing a semiconductor device mounting process to mount the semiconductor device 60 on the substrate for a semiconductor package 50. In the semiconductor device mounting process, the semiconductor device 60 is mounted on the semiconductor device mounting area 45 of the metal layer 40 formed on the substrate 10. The semiconductor device 60 may be mounted on the semiconductor device mounting area 45 by placing the terminal 61 facing upward, and by bonding a package part to the semiconductor device mounting area 45. In this process, by using the substrate for a semiconductor package 50 of the embodiment, since the semiconductor device 60 can be mounted on the semiconductor device mounting area 45 that has a flat surface, the semiconductor device mounting process can be performed readily and surely.

FIG. 11B is a view showing a wire bonding process to connect the terminal 61 of the semiconductor device 60 to the electrode 46 of the metal layer 40 by wire bonding. In the wire bonding process, the terminal 61 of the semiconductor device 60 and the electrode 46 are connected with the bonding wire 70. In this process, by using the substrate for a semiconductor package 50, because the wire bonding is carried out on the electrode 46 that has the flat top surface 41, connection of the bonding wire 70 to the electrode 46 can be performed easily. In addition, since the electrodes 46 are uniform in size and shape, even if a distance between the terminals 61 of the semiconductor device 60 is narrow, a short circuit to an adjacent terminal 61 does not occur, and adapting to miniaturization of the semiconductor device 60 is certainly possible.

FIG. 11C is a view showing a resin sealing process to seal the semiconductor device 60 and so on with the sealing resin 80. In the resin sealing process, the semiconductor device 60 on the substrate 10, the bonding wire 70, the semiconductor device mounting area 45 and the electrode 46 are sealed with the sealing resin 80 from an upper surface, and are thus protected from exterior dust and so on. In the resin sealing process, since a space above the substrate 10 is filled with the sealing resin 80 to cover all the above-mentioned components, spaces below lower parts of the semiconductor device mounting area 45 and electrode 46 on the substrate 10 are all filled with the sealing resin 80 and fixed.

FIG. 11D is a view showing a substrate removal process to remove the substrate 10. In the substrate removal process, there are a substrate removal method that removes the substrate 10 by peeling the substrate 10 from below and a substrate removal method that removes the substrate 10 by dissolving the substrate 10 in solvent.

If the substrate 10 is removed by peeling, to peel the substrate 10 off from below, a force pulling down acts on the metal layer 40 including the semiconductor device mounting area 45 and the electrode 46 electrodeposited on the substrate 10. In this case, if the metal layer 40 including the semiconductor device mounting area 45 and/or the electrode 46 has the same size for the top surface 41 and the bottom surface 42, and has the side surface 43 parallel to the vertical direction, there is a risk of the metal layer 40 falling out of the sealing resin 80 when the substrate 10 is pulled downward and peeled off. However, in the substrate for a semiconductor package 50, because the side surface 43 of the metal layer 40 has a side shape including the slope part 44 of which decreases in circumference as the circumference approaches the bottom surface 42, the sealing resin 80 acts on the metal layer 40 resisting the downward force, which makes it possible to remove only the substrate 10 from the metal layer 40 and the sealing resin 80.

On the other hand, when the substrate 10 is removed by dissolving, the substrate 10 is immersed in solvent that does not affect the sealing resin 80, and the substrate 10 is dissolved and removed. In this case also, in the substrate for a semiconductor package 50, because a border line between the metal layer 40 and the sealing resin 80 is long, intrusion of water can be prevented. This improves humidity resistance, which leads to improved reliability of the semiconductor package 100.

In addition, because the sealing resin 80 acts on the metal layer 40 so as to resist the downward force, it is possible to ensure bonding strength after soldering the semiconductor package 100 onto a substrate for electronic components (which are not shown in FIG. 11D).

FIG. 11E is a view showing a dividing process that divides the semiconductor package 100 including plural of the semiconductor devices 60 to form a semiconductor package 100 for each semiconductor device 60. In the dividing process, by cutting the sealing resin 80 in a vertical direction, semiconductor packages 100 including an exposed semiconductor device mounting area 45 and an exposed outer terminal 47 that is a bottom surface of the electrode 46 on its bottom surface are completed.

In this way, according to the semiconductor package 100 of the embodiment, because the semiconductor package 100 is manufactured by using the substrate for a semiconductor package 50 including the metal layer 40 of which width or circumference at a level decreases as the level approaches the substrate 10, it is possible to surely peel off the substrate 10 and to efficiently manufacture the semiconductor package 100. In addition, because the metal layer 40 has a flat top surface 41, mounting the semiconductor device 60 or wire bonding can be readily and surely performed. Furthermore, since the metal layer 40 has a low height and a uniform shape and size, it is possible to respond to miniaturization of the semiconductor device 60 sufficiently.

Second Embodiment

Figure 12A:
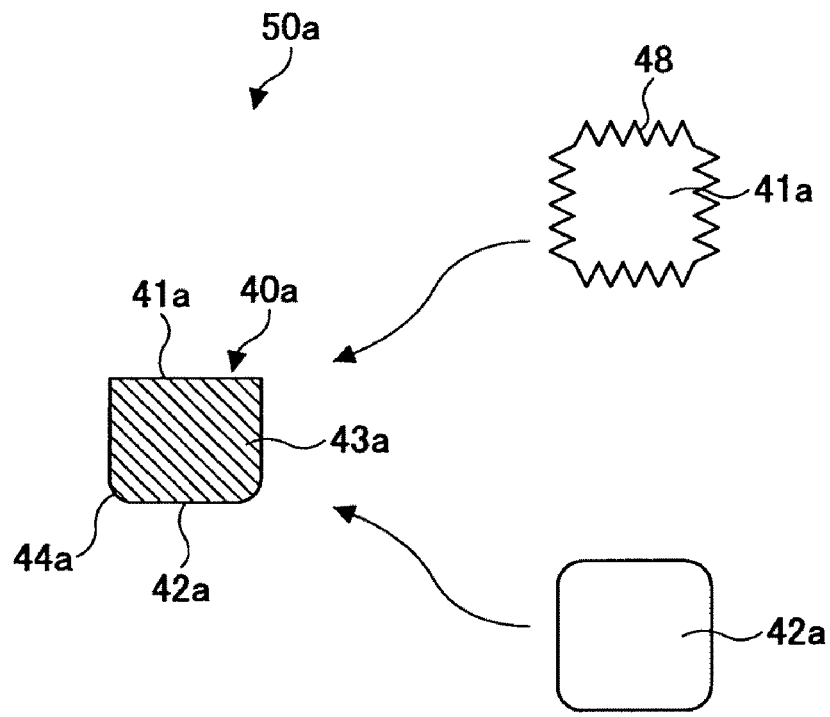
FIG. 12A is an enlarged view showing a metal layer of a substrate for a semiconductor package of a second embodiment of the present invention.
Figure 12B:
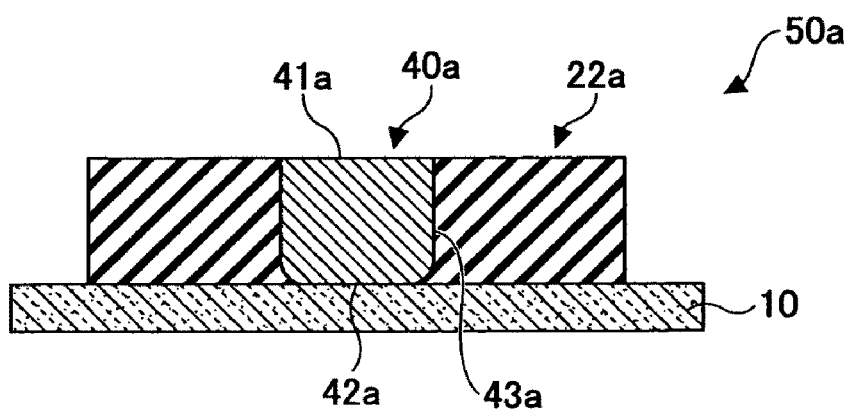
FIG. 12B is a view showing plating process to form the metal layer of the substrate for a semiconductor package of the second embodiment of the present invention.

FIG. 12A and FIG. 12B are views showing an example of a partial configuration of a substrate for a semiconductor package 50a of a second embodiment. FIG. 12A is an enlarged view showing an example of a part of a metal layer 40a. FIG. 12B is a view showing an example of a plating process of a manufacturing method of a substrate for a semiconductor package 50a of the second embodiment.

In FIG. 12A, a side surface 43a of the metal layer 40a has a shape where a top surface 41a, of which width is larger than that of a bottom surface 42a, and a side surface 43a includes a slope part 44a which decreases in circumference as the circumference approaches the bottom surface 42a, at a part around the bottom surface 42a. Therefore, the metal layer 40a has a shape that makes it difficult to be pulled out downward as well as the metal layer 40 of the substrate for a semiconductor package 50 in the first embodiment. More specifically, by such a slope, the substrate for a semiconductor package 50a has a shape where sealing resin supports and fixes the metal layer 40a including an electrode 46 and/or a semiconductor device mounting area 45 from below obliquely upward, and a binding force between the sealing resin and the electrode 46 and/or the semiconductor device mounting area 45 can be improved.

However, in FIG. 12A, referring to a top view and a bottom view of the metal layer 40a, the circumference of the top surface 41a has a saw-tooth appearance and has a zigzag shape 48. On the other hand, the bottom surface 42a has a square shape with round corners as well as the bottom surface 42 of the substrate for a semiconductor package 50a of the first embodiment. In this manner, the metal layer 40a may have the top surface 41a, of which circumference is formed into a zigzag shape 48 like saw teeth. By forming the circumference into the zigzag shape 48, when the metal layer 40a is sealed with resin, it is possible to increase a contact area with the sealing resin 80 and bonding strength. Moreover, when the substrate for a semiconductor package 50a is configured as a semiconductor package 100, since the top surface 41a of the metal layer 40a is hidden by resin sealing, there is no request for an appearance configuration. There is flexibility capable of taking various shapes as long as the shape is superior in function. On the other hand, when configured as the semiconductor package 100, since the bottom surface 42a becomes an outer terminal 47 by being exposed from a bottom surface of the semiconductor package 100, it is desirable for the bottom surface 42a to have a rectilinear circumference shape, not a zigzag shape 48. The bottom surface 42a of the metal layer 40a on the substrate for a semiconductor package 50a has a shape that meets such a request.

In this way, the metal layer 40a of the substrate for a semiconductor package 50a of the second embodiment has a shape that makes it difficult to be pulled out downward. More specifically, the top surface 41a with a lot of flexibility in shape is configured to have the zigzag shape 48 that enhances adherence force. The bottom surface 42a that works as the outer terminal 47 is shaped as an approximate square with a rectilinear circumference. This can improve the prevention effect of the metal layer's being pulled out even more.

FIG. 12B shows an example of a plating process of the manufacturing method of the substrate for a semiconductor package 50a of the second embodiment. The plating process is carried out after forming a resist pattern 22a on a substrate 10 as well as the first embodiment. Thus, by forming the resist pattern 22a so that a top surface circumference has the zigzag shape 48 of a saw-tooth appearance, the shape of the metal layer 40a shown in FIG. 12A can be realized.

Figure 13A:
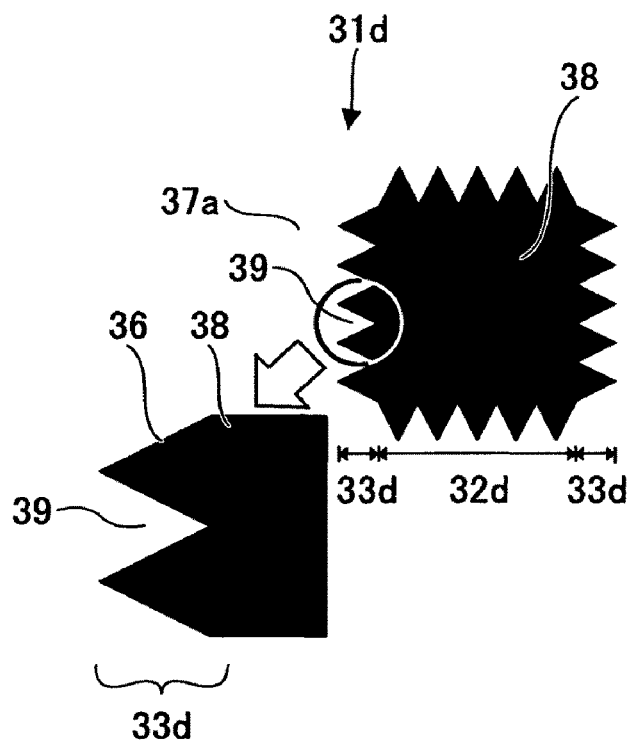
FIG. 13A is a view showing an example of a configuration of a mask pattern of the manufacturing method of the substrate for a semiconductor package of the second embodiment of the present invention.
Figure 13B:
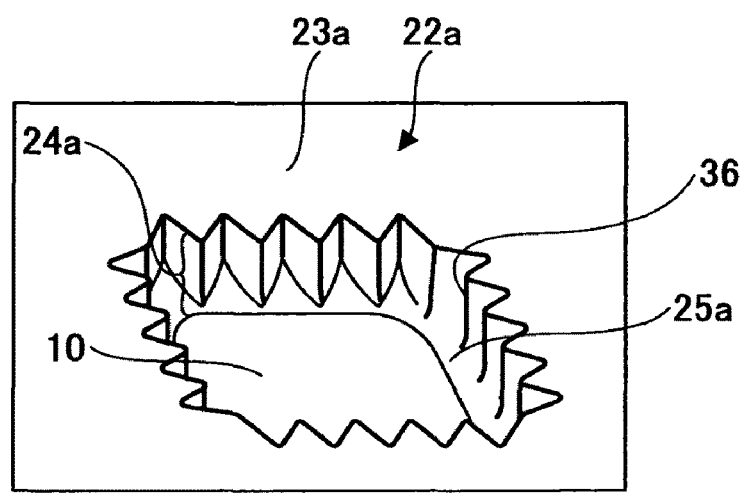
FIG. 13B is a view showing an example of a resist pattern of the manufacturing method of the substrate for a semiconductor package of the second embodiment of the present invention.

FIG. 13A and FIG. 13B are views showing an example of the mask pattern 31d shape of the glass mask 30 and a resist pattern 22a used for a lithography exposure process of the manufacturing method of the substrate for a semiconductor package 50a of the second embodiment.

FIG. 13A is a view showing an example of a mask pattern 31d of a glass mask 30 used for a lithography exposure process of the manufacturing method of the substrate for a semiconductor package 50a of the second embodiment. In FIG. 13A, the mask pattern 31d includes a transmission area 37a, an intermediate transmission area 33d and a light shielding area 32d. The mask pattern 31d, for example, is configured by forming a light shielding part 38 with a predetermined shape of a light shielding film on a glass substrate 37. The transmission area 37a is an area where the glass substrate 37 is exposed. The light shielding area 32d is an approximately square area where the light shielding part 38 is fully formed as well as the mask pattern 31 in the first embodiment. The mask pattern 31d has the intermediate area 33d between the transmission area 37a and the light shielding area 32d. These matters are similar to the mask pattern 31 in the first embodiment.

On the other hand, the intermediate area 33d has a shape that includes a saw-like border line of zigzag shape 36 as a border line between an area of a transmission part 39 and an area of light shielding part 38. In this way, by making the border line that divides the area of the transmission part 39 and the area of the light shielding part 38 in the intermediate area 33d have the zigzag shape 36, the resist pattern 22a that has a top surface of the zigzag shape 36 can be formed. When the mask pattern 31a that has such a pattern is used, it may be thought that the zigzag shape 36 is formed in the same shape from the top to a lower part. However, because the intermediate transmission area 33d is provided between the light shielding area 32d of 0% transmittance and the transmission area 37a of 100% transmittance, as well as the explanation in the first embodiment, the intermediate transmission area 33d is affected by both transmittances. As a result, the transmittance of the intermediate transmission area 33d becomes between 0% and 100%, higher than the light shielding area 32d and lower than the transmission area 37a. Therefore, as the level of resist 20 is lowered, influence from the mask pattern 31d becomes weak, and the transmittance comes close to the transmittance where an intermediate transmittance area is provided as the intermediate transmission area 33d. Then, the zigzag shape 36 becomes smaller as the level approaches the substrate 10. In other words, in this case, the intermediate transmission area 33d includes a light shielding part 38 that has a zigzag circumference and a zigzag transmission part to fit the zigzag shape 36 of the light shielding part 38 in a mixed state. With this, it is possible to make the transmittance of the intermediate area 33d higher than the light shielding area completely covered with a mask, and to adjust the transmittance with a simple mask shape.

FIG. 13B is a view showing an example of the resist pattern 22a that is exposed with a glass mask 30 of the mask pattern 31d in a lithography exposure process and is formed in a development process. In FIG. 13B, a top surface 23a of the resist pattern 22a includes a zigzag shape 36 in the almost same shape as the mask pattern 31d, formed by transferring. The zigzag shape 36 of a side surface 24a decreases as the zigzag shape 36 approaches the substrate 10 of a bottom surface. Around the substrate 10, the side surface 24a includes a slope part 25a that extends inward and downward in a hollow and whose circumference becomes small. Due to the slope part 25a, a slope part 44a (See FIG. 12A) can be formed into the metal layer 40a, which becomes a shape that makes it possible to apply a force upward after being sealed with sealing resin 80.

Figure 14A:
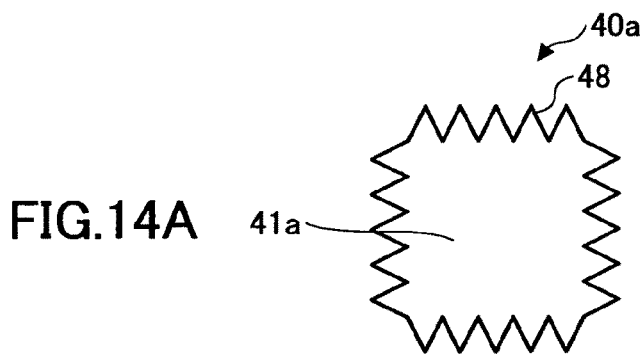
FIG. 14A is a top view showing a metal layer of the substrate for a semiconductor package of the second embodiment.
Figure 14B:
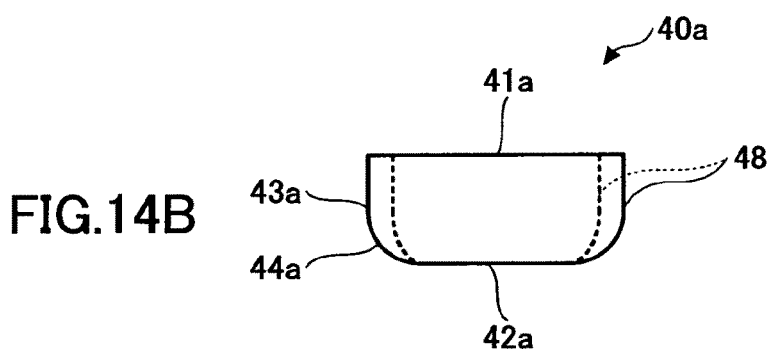
FIG. 14B is a side view showing the metal layer of the substrate for a semiconductor package of the second embodiment.
Figure 14C:
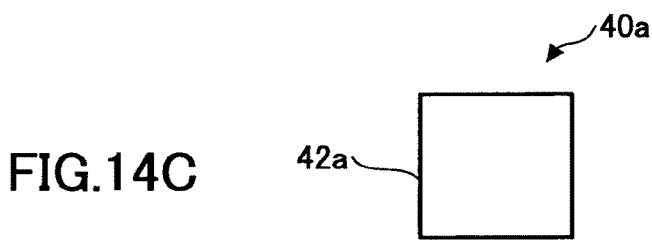
FIG. 14C is a bottom view showing the metal layer of the substrate for a semiconductor package of the second embodiment.
Figure 14D:
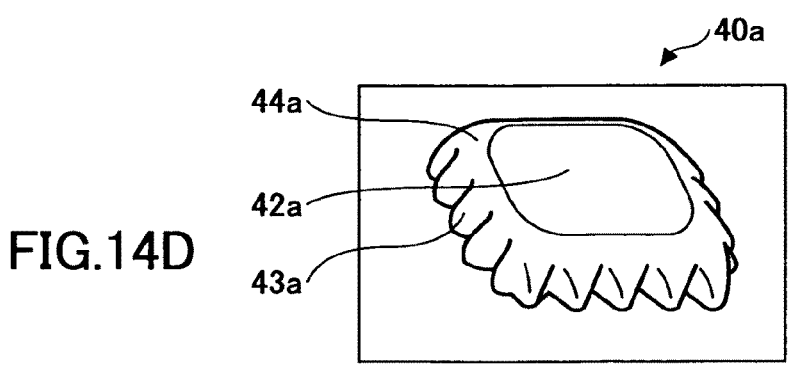
FIG. 14D is a cubic and oblique perspective view showing a vertically inverted metal layer of the substrate for a semiconductor package of the second embodiment.

FIG. 14A through FIG. 14D are views showing an example of a shape of the metal layer 40a formed by a plating process with the resist pattern 22a described in FIG. 13A and FIG. 13B. FIG. 14A is a top view of the metal layer 40a. FIG. 14B is a side view of the metal layer 40a. FIG. 14C is a bottom view of the metal layer 40a. FIG. 14D is a three-dimensional oblique view of an inverted metal layer 40a.

As shown in FIG. 14A, a circumference of a top surface 41a of the metal layer 40a has a saw-like zigzag shape 48, which can increase the contact area of the side surface 43a with sealing resin 80 and can improve bonding force. In addition, as shown in FIG. 14C, a bottom surface 42a of the metal layer 40a has a smaller area than the top surface 41a, and is an approximate square that is used as the outer terminal 47 in general.

Moreover, as shown in FIG. 14B, in a cross-sectional shape of the metal layer 40a, a slope part 44a where a cross-sectional area surface parallel to the substrate 10 decreases as the surface parallel to the substrate 10 approaches the bottom surface 42a is formed around the bottom surface 42a. Also, the zigzag shape 48 of the top surface 41a decreases at a level as the level approaches the bottom surface 42a. The slope part 44a has a shape capable of applying an upward force when receiving a pull downward force after being sealed with the sealing resin 80. Therefore, the metal layer 40a is configured to be able to prevent the metal layer 40a from being pulled down in a substrate removal process of the manufacturing method of the semiconductor package 100. Furthermore, the top surface 41a has a flat surface, which is appropriate for semiconductor device 60 mounting and wire bonding. This makes it possible to improve adhesion strength for semiconductor device mounting and to facilitate and bind strongly connections between a terminal of the semiconductor device and an electrode by wire bonding. In addition, because there is no flared part in a transverse direction, and a height is less than or equal to the resist pattern 22a, the metal layer 40a has a shape sufficiently capable of responding to miniaturization and meeting demands for high accuracy of a metal layer of a substrate for a semiconductor package 50a.

FIG. 14D is a three-dimensional oblique perspective view of a vertically inverted metal layer 40a. In FIG. 14D, the bottom surface 42a to be the outer terminal 47 has a flat surface. Also, the metal layer 40a has a structure where sealing resin wraps around the slope part 44a formed into the side surface 43a near the bottom surface 42a, which is a shape capable of preventing movement of the metal layer 40a by providing a downward force even if an upward force acts.

According to the semiconductor package 100 of the second embodiment, it is possible to solidly maintain a binding force between the sealing resin 80 and the metal layer 40a by the zigzag shape 48, and to prevent the metal layer 40a from falling out of the sealing resin 80 because the metal layer 40a tapers downward. In addition, it is possible to prevent water intrusion from a back side of the semiconductor package 100 through borders between the metal layer 40a or an electrode and the sealing resin 80, and to realize superior water resistance. Also, it is possible to carry out wire bonding and semiconductor device mounting easily on a flat surface and to improve adhesion force of the wire bonding and the semiconductor device mounting.

Since a manufacturing method of the substrate for a semiconductor package 50a of the second embodiment is similar to the manufacturing method of the substrate for a semiconductor package 50 described in the first embodiment except for the mask pattern 31d of the glass mask 30 in the lithography exposure process, the explanation is omitted.

According to the manufacturing method of the substrate for a semiconductor package 50a of the second embodiment, it is possible to make the substrate for a semiconductor package 50a have a configuration that improves adhesion force by increasing a contact area between the metal layer 40a and the sealing resin 80 by forming the zigzag shape 48 into an upper part, and to form the metal layer 40a that has a shape appropriate to use its bottom surface as an outer terminal because the zigzag shape 48 becomes smaller on the substrate 10 side.

Moreover, with regard to a semiconductor package 100 manufactured by using the substrate for a semiconductor package 50a of the second embodiment and a manufacturing method of the semiconductor package 100, since an explanation is similar to that in the first embodiment, the explanation is omitted.

In the above-discussed embodiments, the first embodiment and the second embodiment can be combined, and descriptions in the first embodiment can be applied to the second embodiment.

Furthermore, the lithography exposure process of the first embodiment and the second embodiment is explained by citing an example of a lithography exposure process that forms a resist pattern 22 with a negative type resist 20, and configurations of the mask patterns 31, 31a to 31d relate to negative type mask patterns. However, a manufacturing method of a substrate for a semiconductor package, a manufacturing method of a semiconductor package, a substrate for a semiconductor package and a semiconductor package of the present invention are applicable to a positive type mask pattern. If a glass mask 30 corresponding to a positive type resist 20 is used, by inverting a layout relationship between the transmission area 37a and the light shielding area in the mask patterns 31, 31a to 31d described in the embodiments, and by inverting a layout relationship between the transmission part 34, 34a to 34c, 39 and the light shielding part 38 in the intermediate transmission areas 33, 33a to 33d, the description in the first embodiment and the second embodiment can be directly applied.

According to the above-discussed embodiments of the present invention, it is possible to form a metal layer on a substrate for a semiconductor package with a shape that improves its adhesion power with a sealing resin.

More specifically, according to the manufacturing method of the substrate for a semiconductor package of the above-discussed embodiments, it is possible to form a metal layer that has a side shape including a slope shape where a circumference at a level decreases as the level gets close to a substrate side; if the substrate is peeled off after resin sealing, a state where the sealing resin supports the slope part of the metal layer from below is formed, and enough tolerability is maintained in the following semiconductor manufacturing processes.

Furthermore, it is possible to make a top surface of the metal layer flat, to make a width in a transverse direction uniform, and to sufficiently adapt to miniaturization of a semiconductor package and the distance between terminals of a semiconductor package.

Moreover, it is possible to utilize a metal layer that has a shape capable of ensuring tolerability as an electrode or a semiconductor device mounting area of a substrate for a semiconductor mounting: it is possible to make use of a metal layer shaped to have high tolerability.

According to the manufacturing method of the semiconductor package of the above-discussed embodiments of the present invention, in a process of removing a substrate from a semiconductor package, it is possible to decrease a concern that a metal layer may be pulled out of sealing resin from which the substrate is being removed, and to manufacture a semiconductor package with a high throughput.

Also, adequate adhesion strength can be ensured after soldering a semiconductor device on a substrate for electronic components. Furthermore, it is possible to prevent water intrusion from a back side of a semiconductor package through border parts between a metal layer or an electrode layer and a sealing resin layer, which can realize superior humidity resistance.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A substrate for a semiconductor package comprising:
an electrode of a metal layer on the substrate; and
a semiconductor mounting area of the metal layer on the substrate,
wherein at least one of an electrode and the semiconductor mounting area have a top surface in a zigzag shape and a side surface including a slope part decreasing in circumference and having the zigzag shape decreasing in size as the circumference approaches the substrate.

2. The substrate for a semiconductor package as claimed in claim 1,
wherein the top surface of one of an electrode and the semiconductor mounting area has a flat surface.

3. A semiconductor package comprising:
an electrode metal layer including a top surface used for wire bonding and a bottom surface used for an outer terminal;
a semiconductor device mounting metal layer to support a semiconductor device;
the semiconductor device mounted on the semiconductor device mounting metal layer and including a terminal connected to the electrode metal layer by the wire bonding; and
a resin body to seal the semiconductor device without sealing the bottom surface of the electrode metal layer,
wherein at least one of an electrode metal layer and the semiconductor device mounting metal layer has a top surface in a zigzag shape and a side surface including a slope part decreasing in circumference and having the zigzag shape decreasing in size as the circumference approaches a bottom surface.

4. The semiconductor package as claimed in claim 3,
wherein the top surface of one of the electrode and semiconductor mounting area have a flat surface.

* * * * *